(12) United States Patent
Nakagawa

(10) Patent No.: US 11,678,541 B2
(45) Date of Patent: Jun. 13, 2023

(54) DISPLAY DEVICE INCLUDING TERMINAL REGIONS FACING EACH OTHER ACROSS THE DISPLAY REGION

(71) Applicant: SHARP KABUSHIKI KAISHA, Sakai (JP)

(72) Inventor: Kiyoshi Nakagawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 372 days.

(21) Appl. No.: 17/043,614

(22) PCT Filed: Mar. 30, 2018

(86) PCT No.: PCT/JP2018/013828
§ 371 (c)(1),
(2) Date: Sep. 29, 2020

(87) PCT Pub. No.: WO2019/187077
PCT Pub. Date: Oct. 3, 2019

(65) Prior Publication Data
US 2021/0074800 A1    Mar. 11, 2021

(51) Int. Cl.
*H10K 59/131* (2023.01)
*H10K 59/35* (2023.01)

(52) U.S. Cl.
CPC ......... *H10K 59/131* (2023.02); *H10K 59/351* (2023.02); *H10K 59/353* (2023.02)

(58) Field of Classification Search
CPC combination set(s) only.
See application file for complete search history.

(56) References Cited

U.S. PATENT DOCUMENTS

| | | |
|---|---|---|
| 2007/0096135 A1 | 5/2007 | Matsumoto |
| 2009/0184626 A1 | 7/2009 | Kim et al. |
| 2009/0184627 A1 | 7/2009 | Kim et al. |
| 2009/0184899 A1 | 7/2009 | Kim et al. |
| 2016/0190228 A1* | 6/2016 | Park ................. H01L 27/3276 257/40 |

FOREIGN PATENT DOCUMENTS

| | | |
|---|---|---|
| JP | 2004-356052 A | 12/2004 |
| JP | 2006-243322 A | 9/2006 |
| JP | 2007-128049 A | 5/2007 |
| JP | 2009-169373 A | 7/2009 |
| JP | 2009-169374 A | 7/2009 |
| JP | 2009-169376 A | 7/2009 |

* cited by examiner

*Primary Examiner* — Suberr L Chi
(74) *Attorney, Agent, or Firm* — ScienBiziP, P.C.

(57) ABSTRACT

A display device includes a display panel including a display region, a first terminal region and a second terminal region facing each other across the display region, a first high power supply trunk wiring line disposed between the display region and the first terminal region, a second high power supply trunk wiring line disposed between the display region and the second terminal region, and a high power supply voltage line. The first high power supply trunk wiring line is connected via the first terminal region to a high power supply voltage source, and the second high power supply trunk wiring line is connected to the high power supply voltage source via the second terminal region and a flexible cable connected to the second terminal region.

20 Claims, 18 Drawing Sheets

DISPLAY DEVICE INCLUDING TERMINAL REGIONS FACING EACH OTHER ACROSS THE DISPLAY REGION

TECHNICAL FIELD

The disclosure relates to a display device.

BACKGROUND ART

PTLs 1 to 4 disclose a technology for feeding power from a periphery of a display region into a display region via a power source line.

CITATION LIST

Patent Literature

PTL 1: Japanese Patent Application Publication No. 2007-128049 A
PTL 2: Japanese Patent Application Publication No. 2009-169373 A
PTL 3: Japanese Patent Application Publication No. 2009-169374 A
PTL 4: Japanese Patent Application Publication No. 2009-169376 A

SUMMARY

Technical Problem

The technologies disclosed in PTLs 1 to 4 pose a problem in that a configuration for reducing a voltage drop (Ir-Drop) occurring during passage through the power source line is complex.

Solution to Problem

A display device according to an aspect of the disclosure includes a display panel including a display region, a first terminal region and a second terminal region facing each other across the display region, a first high power supply trunk wiring line disposed between the display region and the first terminal region, a second high power supply trunk wiring line disposed between the display region and the second terminal region, and a high power supply voltage line that is a branch line disposed in the display region and branching from the first high power supply trunk wiring line or the second high power supply trunk wiring line. The first high power supply trunk wiring line is connected via the first terminal region to a high power supply voltage source provided outside the display panel. The second high power supply trunk wiring line is connected to the high power supply voltage source via the second terminal region and a flexible cable connected to the second terminal region.

Advantageous Effects of Invention

According to an aspect of the disclosure, even with a simple configuration, luminance gradient occurring in the display region due to IR-drop can be reduced.

BRIEF DESCRIPTION OF DRAWINGS

FIG. 4($b$) is a plan view schematically illustrating the configuration of the display device according to the first embodiment.

FIG. 6($b$) is a plan view schematically illustrating the another configuration of the display device according to the first embodiment.

FIG. 7($b$) is a plan view schematically illustrating the another configuration of the display device according to the first embodiment.

FIG. 8($b$) is a plan view schematically illustrating the another configuration of the display device according to the first embodiment.

FIG. 9($b$) is a plan view schematically illustrating the another configuration of the display device according to the first embodiment.

FIG. 18(b) is a plan view schematically illustrating the configuration of the display device according to the second embodiment.

DESCRIPTION OF EMBODIMENTS

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

Figure 1:
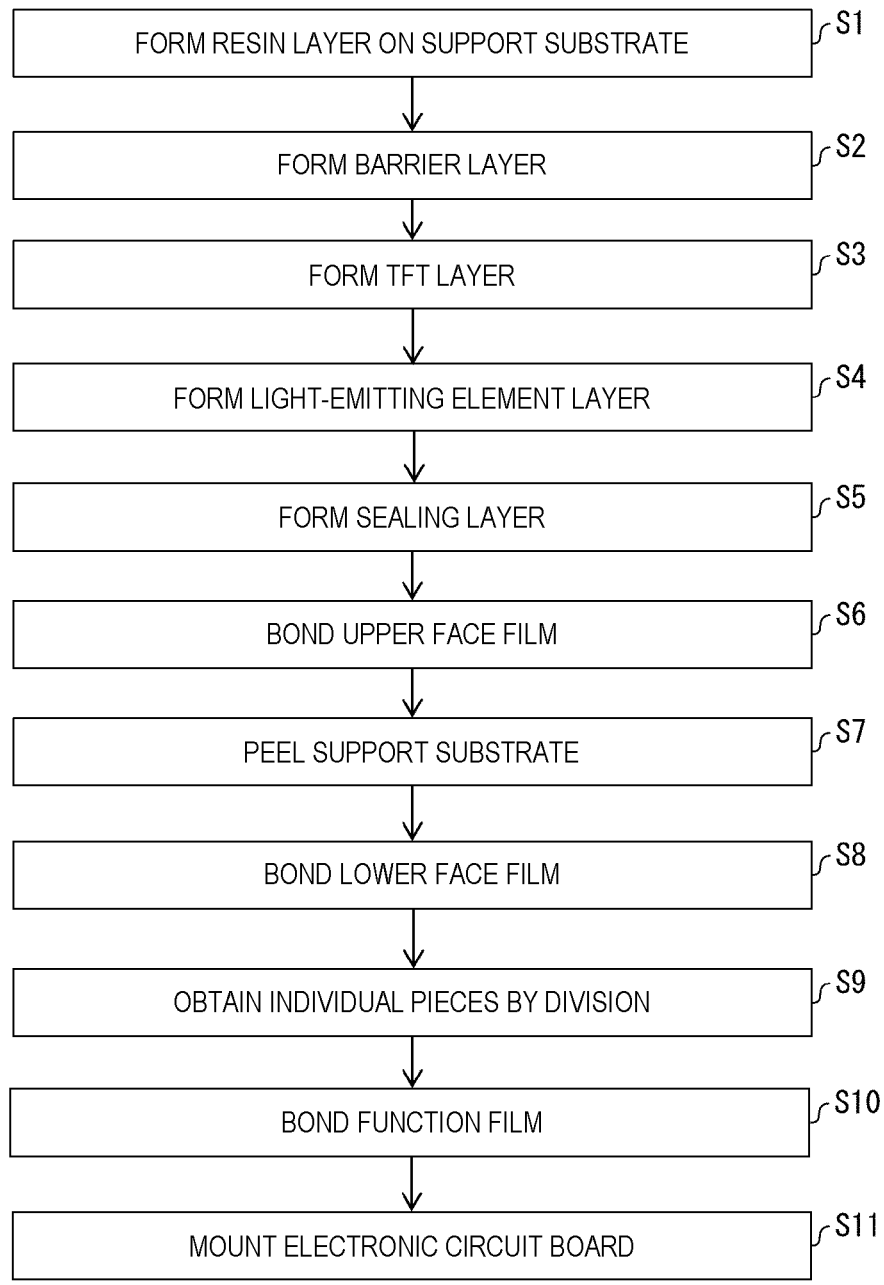
FIG. 1 is a flowchart illustrating an example of a manufacturing method of a display device.
Figure 2:
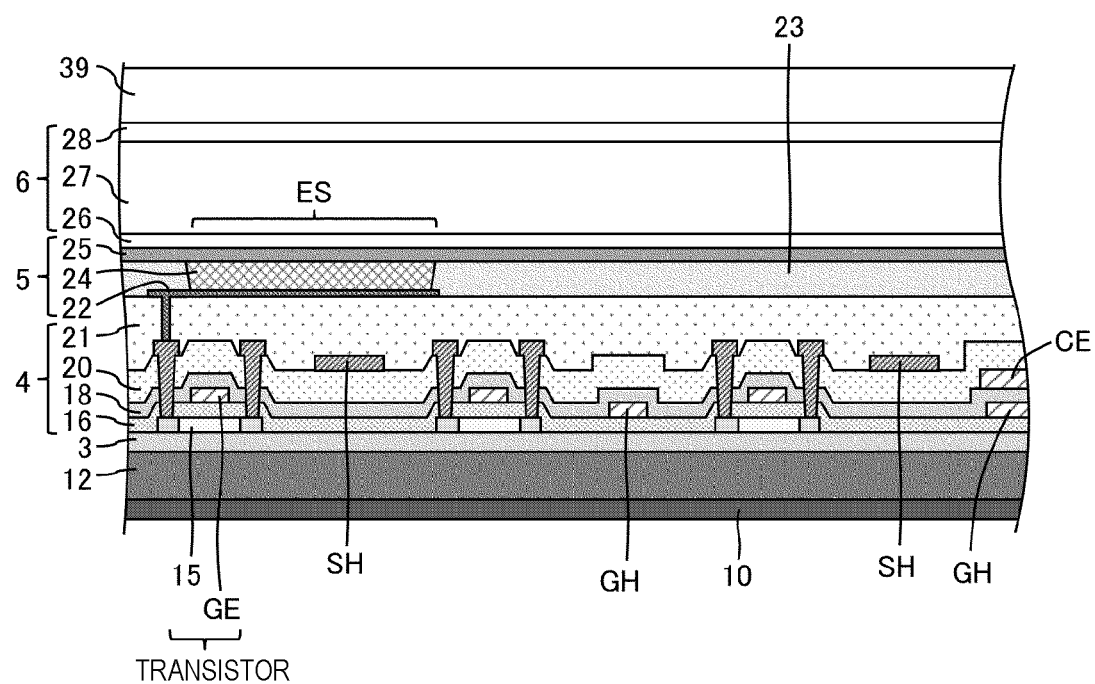
FIG. 2 is a cross-sectional view illustrating a configuration example of a display region of the display device.

FIG. 1 is a flowchart illustrating an example of a manufacturing method of a display device. FIG. 2 is a cross-sectional view illustrating a configuration example of a display region of the display device.

In a case that a flexible display device is manufactured, as illustrated in FIGS. 1 and 2, a resin layer 12 is first formed on a support substrate that is transparent (for example, mother glass) (step S1). Next, a barrier layer 3 is formed (step S2). Next, a TFT layer 4 is formed (step S3). Next, a top-emitting type light-emitting element layer 5 is formed (step S4). Next, a sealing layer 6 is formed (step S5). Next, an upper face film is bonded to the sealing layer 6 (step S6).

Next, the support substrate is peeled from the resin layer 12 by irradiation with laser light or the like (step S7). Next, a lower face film 10 is bonded to the lower face of the resin layer 12 (step S8). Next, a layered body including the lower face film 10, the resin layer 12, the barrier layer 3, the TFT layer 4, the light-emitting element layer 5, and the sealing layer 6 is divided and a plurality of individual pieces are obtained (step S9). Next, a function film 39 is bonded on the obtained individual pieces (step S10). Next, an electronic circuit board (for example, a chip on film (COF) and/or a flexible printed circuit) is mounted on a portion (terminal portion) of an outer side (non-display region, frame) of the display region in which a plurality of subpixels are formed (step S11). Note that steps S1 to S11 are performed by a display device manufacturing apparatus (including a film forming apparatus performing steps S1 to S5).

Examples of the material of the resin layer 12 include a polyimide and the like. A portion of the resin layer 12 can be replaced with a resin film (for example, a polyimide film) including two layers and an inorganic insulating film sandwiched between the layers.

The barrier layer 3 is a layer for preventing foreign matters such as water and oxygen from reaching the TFT layer 4 and the light-emitting element layer 5, and for example, can be formed of a silicon oxide film, a silicon nitride film, or a silicon oxynitride film, or a layered film of these films, the films being formed by CVD.

The TFT layer 4 includes a semiconductor film 15, an inorganic insulating film 16 (gate insulating film) in an upper layer overlying the semiconductor film 15, gate electrodes GE and gate wiring lines GH in an upper layer overlying the inorganic insulating film 16, an inorganic insulating film 18 in an upper layer overlying the gate electrodes GE and the gate wiring lines GH, a capacitance electrode CE in an upper layer overlying the inorganic insulating film 18, an inorganic insulating film 20 in an upper layer overlying the capacitance electrode CE, a source wiring line SH in an upper layer overlying the inorganic insulating film 20, and a flattening film 21 (interlayer insulating film) in an upper layer overlying the source wiring line SH.

The semiconductor film 15 is formed of, for example, a low-temperature polysilicon (LTPS) or an oxide semiconductor (for example, an In—Ga—Zn—O-based semiconductor), and a transistor (TFT) includes the semiconductor film 15 and the gate electrode Ge. FIG. 2 illustrates that the transistor has a top gate structure. However, the transistor may have a bottom gate structure.

The gate electrodes GE, the gate wiring lines GH, the capacitance electrode CE, and the source wiring line SH are each formed of a single layer film or a layered film of metal including, for example, at least one of aluminum, tungsten, molybdenum, tantalum, chromium, titanium, and copper. The TFT layer 4 in FIG. 2 includes one semiconductor layer and three metal layers.

Each of the inorganic insulating films 16, 18, and 20 can be formed of, for example, a silicon oxide (SiOx) film or a silicon nitride (SiNx) film, or a layered film of these films, the films being formed by CVD. The flattening film 21 can be formed of, for example, a coatable photosensitive organic material such as polyimide or acrylic.

The light-emitting element layer 5 includes an anode 22 in an upper layer overlying the flattening film 21, an edge cover 23 having insulating properties and covering an edge of the anode 22, an electroluminescence (EL) layer 24 in an upper layer overlying the edge cover 23, and a cathode 25 in an upper layer overlying the EL layer 24. The edge cover 23 is formed by applying an organic material such as polyimide or acrylic and then by patterning the organic material by photolithography, for example.

For each of the subpixels, a light-emitting element ES including an anode 22 shaped like an island, an EL layer 24, and a cathode 25 (for example, OLED: organic light emitting diode, QLED: quantum dot light emitting diode) is formed in the light-emitting element layer 5, and a subpixel circuit controlling the light-emitting element ES is formed in the TFT layer 4.

For example, the EL layers 24 are formed by layering a hole injection layer, a hole transport layer, a light-emitting layer, an electron transport layer, and an electron injection layer in this order, from the lower layer side. The light-emitting layer is formed into an island shape in an opening in the edge cover 23 (for each subpixel) by vapor deposition or an ink-jet method. Other layers are formed in an island shape or a solid-like shape (common layer). A configuration is also possible in which one or more layers are not formed, out of the hole injection layer, the hole transport layer, the electron transport layer, and the electron injection layer.

In a case that the light-emitting layer of an OLED is formed by vapor deposition, a fine metal mask (FMM) is used. The FMM is a sheet (made of, for example, an invar material) having a large number of openings, and a light-emitting layer in island shapes (corresponding to one subpixel) is formed by an organic material passing through one opening.

The light-emitting layer of the QLED can be formed into the light-emitting layer in island shapes (corresponding to one subpixel), for example, by ink-jet coating a solvent having quantum dots diffused therein.

The anode (anode electrode) 22 is formed by layering Indium Tin Oxide (ITO) and silver (Ag) or an alloy containing Ag, for example, and have light reflectivity. The cathode (cathode electrode) 25 can be formed of a transparent conductive material such as a MgAg alloy (extremely thin film), ITO, or Indium zinc Oxide (IZO).

In a case that the light-emitting element ES is an OLED, positive holes and electrons are recombined inside the light-emitting layer by a drive current between the anode 22 and the cathode 25, thus generating excitons. During transition of excitons toward a ground state, light is emitted. Since the cathode 25 is transparent and the anode 22 has light reflectivity, the light emitted from the EL layer 24 travels upward and becomes top-emitting.

In a case that the light-emitting element ES is a QLED, positive holes and electrons are recombined inside the light-emitting layer by the drive current between the anode 22 and the cathode electrode 25, thus generating excitons. During transition of the excitons from a conduction band level toward a valence band level of quantum dots, light is emitted.

A light-emitting element (such as an inorganic light emitting diode) other than the OLED or QLED may be formed in the light-emitting element layer 5.

The sealing layer 6 is transparent, and includes an inorganic sealing film 26 covering the cathode 25, an organic buffer film 27 in an upper layer overlying the inorganic sealing film 26, and an inorganic sealing film 28 in an upper layer overlying the organic buffer film 27. The sealing layer 6 covering the light-emitting element layer 5 inhibits foreign matter, such as water and oxygen, from penetrating to the light-emitting element layer 5.

Each of the inorganic sealing film 26 and the inorganic sealing film 28 may be formed of, for example, a silicon oxide film, a silicon nitride film, or a silicon oxynitride film, or a layered film of these films, the films being formed by CVD. The organic buffer film 27 is a transparent organic film having a leveling effect and can be formed of a coatable organic material such as acrylic. The organic buffer film 27 can be formed, for example, by ink-jet coating, but a bank configured to hold back droplets may be provided in the non-display region.

The lower face film 10 is bonded on a lower face of the resin layer 12 after the support substrate is peeled off, thus providing a display device with excellent flexibility. The lower face film 10 is, for example, a PET film. The function film 39 has at least one of, for example, an optical compensation function, a touch sensor function, and a protection function.

The flexible display device has been described. However, in a case that a non-flexible display device is manufactured, formation of the resin layer, replacement of the base material, and the like are unnecessary. Thus, for example, steps S2 to S5 corresponding to layering steps are performed on the glass substrate, and the process subsequently proceeds from step S9.

Figure 3:
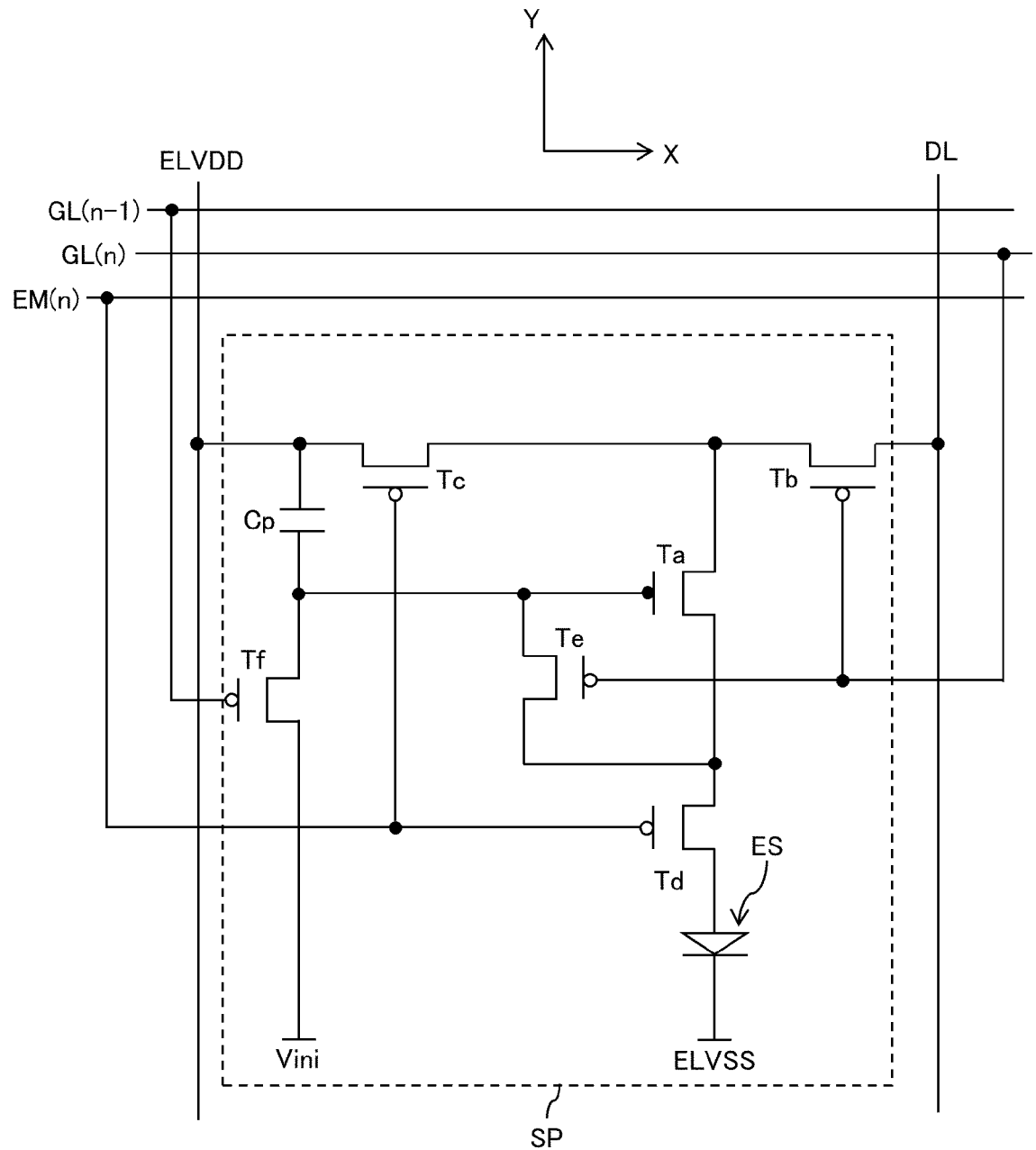
FIG. 3 is a circuit diagram illustrating a configuration example of a subpixel in the display region.

FIG. 3 is a circuit diagram illustrating a configuration example of the subpixel in the display region. The TFT layer 4 in FIG. 2 is provided with scanning signal lines GL(n−1) and GL(n) and light emission signal lines EM(n) extending in the direction of an X axis (row direction), and data lines DL extending in the direction of a Y axis (column direction). The subpixel SP includes a subpixel circuit including a drive transistor Ta, a switch transistor Tb, a power supply control transistor Tc, a light emission control transistor Td, a threshold voltage compensation transistor Te, an initialization transistor Tf, and a capacity Cp, which are formed in the TFT layer 4 illustrated in FIG. 2, and the light-emitting element ES (an organic light-emitting diode, for example) formed in the light-emitting element ES, which is formed in the light-emitting element layer 5 illustrated in FIG. 2. The switch transistor Tb is connected to the scanning signal line GL(n) and the data line DL. During a period when the scanning signal line GL(n) is active, a potential signal corresponding to display gray scale data is fed from the data line DL to the subpixel SP. During a period when the light emission signal line EM(n) is active, the light-emitting device ES emits light at a luminance corresponding to the display gray scale data.

Figure 4:
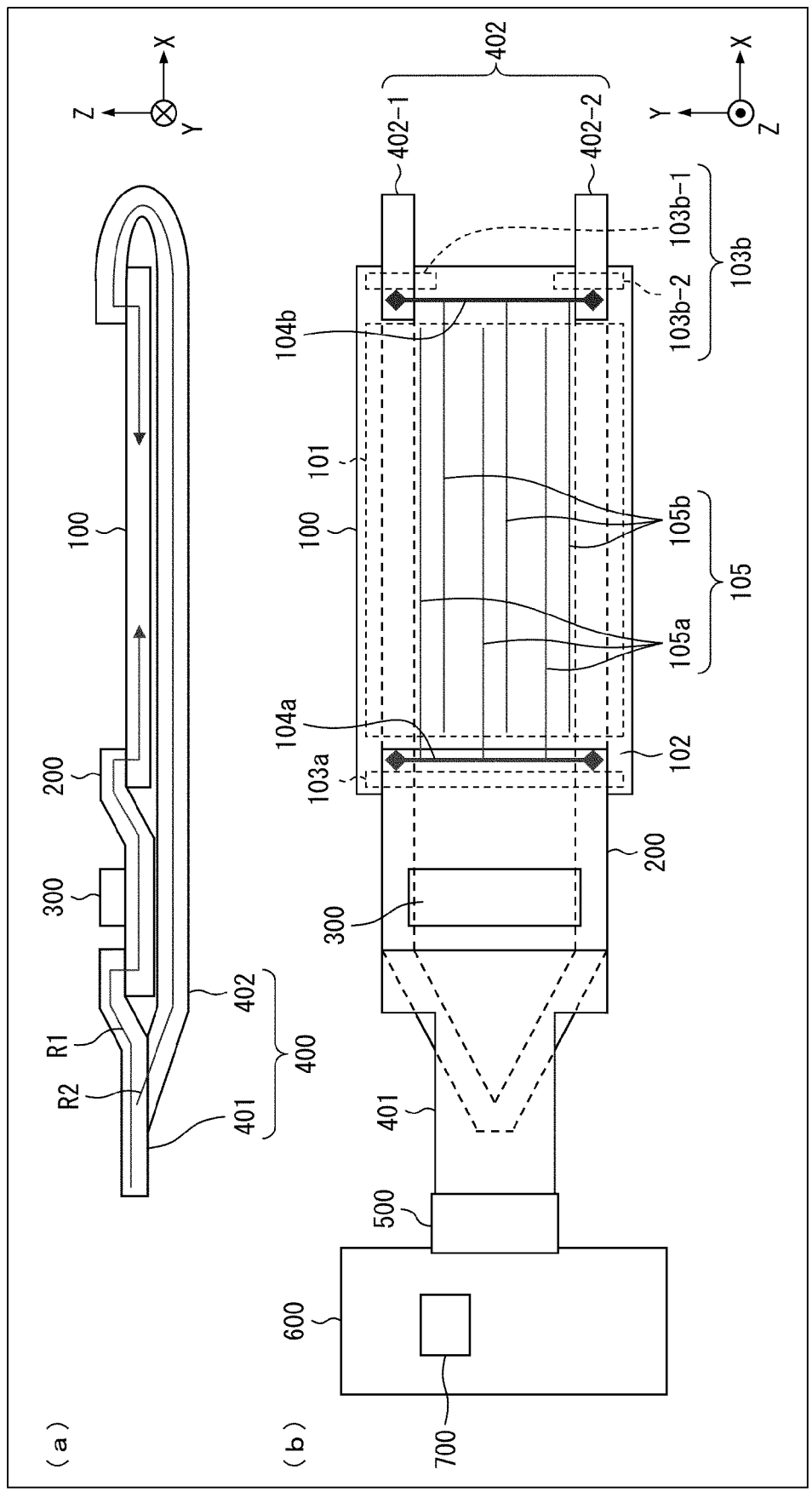
FIG. 4($a$) is a cross-sectional view schematically illustrating a configuration of a display device according to a first embodiment.

First Embodiment (a) of FIG. 4 is a cross-sectional view schematically illustrating a configuration of a display device according to a first embodiment of the disclosure, and (b) of FIG. 4 is a plan view schematically illustrating the configuration of the display device.

As illustrated in (a) and (b) of FIG. 4, the display device according to the present embodiment includes a display panel 100, a chip on film (COF) 200 on which a source driver 300 is mounted, a flexible printed circuit (FPC) board 400 including a flexible substrate 401 and a flexible cable 402 provided on the flexible substrate 401.

As illustrated in (b) of FIG. 4, the display panel 100 is provided with a display region 101 and a non-display region (frame) 102, and a first terminal region 103a and a second terminal region 103b. A first high power supply trunk wiring line 104a is connected to the first terminal region 103a, and a second high power supply trunk wiring line 104b is connected to the second terminal region 103b. The first high power supply trunk wiring line 104a and the second terminal region 103b extend along the column direction of the plurality of subpixels formed in the display region 101 (the direction of the Y axis in (b) of FIG. 4). Note that in the present embodiment, the second terminal region 103b is a region including a second-first terminal region 103b-1 and a second-second terminal region 103b-2.

As illustrated in (b) of FIG. 4, the display panel 100 is provided with a high power supply voltage line group 105 including a plurality of first high power supply voltage lines 105a and a plurality of second high power supply voltage lines 105b. Each of the first high power supply voltage lines 105a and the second high power supply voltage lines 105b ("ELVDD" in FIG. 3) included in the high power supply voltage line group 105 are wiring lines for supplying high power supply voltages to the above-described subpixels connected to the respective lines, as illustrated in FIG. 3. The first high power supply voltage lines 105a and the second high power supply voltage lines 105b extend along the row direction (direction of the X axis in (b) of FIG. 4) of the plurality of subpixels formed in the display region 101.

Each of the first high power supply voltage lines 105a is connected at one end to the first high power supply trunk wiring line 104a, while the other end is terminated. Each of the first high power supply voltage lines 105a is a branch line branching from the first high power supply trunk wiring line 104a to feed a high power supply voltage fed from the first high power supply trunk wiring line 104*a* to the subpixel connected to the first high power supply voltage line 105*a*. Each of the second high power supply voltage lines 105*b* is connected at one end to the second high power supply trunk wiring line 104*b*, while the other end is terminated. Each of the second high power supply voltage lines 105*b* is a branch line branching from the second high power supply trunk wiring line 104*b* to feed a high power supply voltage fed from the second high power supply trunk wiring line 104*b* to the subpixel connected to the second high power supply voltage line 105*b*.

Each of the first high power supply trunk wiring line 104*a* and the second high power supply trunk wiring line 104*b* has a larger wiring line width than each of the first high power supply voltage lines 105*a* and the second high power supply voltage lines 105*b*. Each of the first high power supply trunk wiring line 104*a* and the second high power supply trunk wiring line 104*b* offers lower resistance than each of the first high power source voltage lines 105*a* and the second high power supply voltage lines 105*b*. Thus, an Ir-Drop occurring in the first high power supply trunk wiring line 104*a* and the second high power supply trunk wiring line 104*b* is at a negligible level compared to an Ir-Drop occurring in each of the first high power supply voltage lines 105*a* and the second high power supply voltage lines 105*b*.

Note that, for visibility of the figure, (b) of FIG. 4 merely representatively illustrate three of the first high power supply voltage lines 105*a* connected to the first high power supply trunk wiring line 104*a* and three of the second high power supply voltage lines 105*b* connected to the second high power supply trunk wiring line 104*b* and that the present embodiment is not limited to these numbers. The number of the first high power supply voltage lines 105*a* and the number of the second high power supply voltage lines 105*b* may vary as described below, but the total number of the first high power supply voltage lines 105*a* and the second high power supply voltage lines 105*b* included in the high power supply voltage line group 105*b* is equal to the number of rows of subpixels formed in the display region 101 (the number of rows of subpixels aligned in the direction of the Y axis in (b) of FIG. 4).

It should be noted that the first high power supply trunk wiring line 104*a* and the second high power supply trunk wiring line 104*b* are fed, via paths R1 and R2 (see (a) of FIG. 4) differing from each other, with a high power supply voltage output from a high power supply voltage source 700 disposed outside the display panel 100.

With each of the first high power supply voltage lines 105*a* focused on, an Ir-Drop occurs in the high power supply voltage fed to the first high power supply voltage line 105*a* during passage through the first high power supply voltage line 105*a*, and thus the value of the voltage gradually decreases along the positive direction of the X axis in (b) of FIG. 4. Thus, in the rows of the subpixels connected to each of the first high power supply voltage line 105*a*, a luminance gradient occurs in which luminance gradually decreases along the positive direction of the X axis in (b) of FIG. 4.

On the other hand, with each of the second high power supply voltage lines 105*b* focused on, an Ir-Drop occurs in the high power supply voltage fed to the second high power supply voltage line 105*b* during passage through the second high power supply voltage line 105*b*, and thus the value of the voltage gradually decreases along the positive direction of the X axis in (b) of FIG. 4. Thus, in the rows of the subpixels connected to each of the second high power supply voltage line 105*b*, a luminance gradient occurs in which luminance gradually decreases along the positive direction of the X axis in (b) of FIG. 4.

However, the luminance gradient appearing in each first high power supply voltage line 105*a* represents an inclination opposite to the inclination of the luminance gradient appearing in the second high power supply voltage line 105*b* as described above. In other words, with the positive orientation of the X axis in (b) of FIG. 4 focused on, the luminance gradually decreases in the rows of subpixels connected to each of the first high power supply voltage lines 105*a*, whereas the luminance gradually increases in the rows of subpixels connected to each of the second high power supply voltage lines 105*b*. Thus, the luminance gradient appearing in each of the first high power supply voltage lines 105*a* offsets the luminance gradient appearing in each of the second high power supply voltage lines 105*b*, and in the entire display region 101, occurrence of the luminance gradient is suppressed. Of course, with the negative direction of the X axis in (b) of FIG. 4 focused on, the relationship opposite to the relationship described above is established.

For suppression of occurrence of the luminance gradient in the entire display region 101, for example, it is necessary to appropriately adjust the number of the first high power supply voltage lines 105*a* and the number of the second high power supply voltage lines 105*b* and/or the arrangement configuration of the first high power supply voltage lines 105*a* and the second high power supply voltage lines 105*b* in the direction of the Y axis in (b) of FIG. 4. The latter adjustment will be described below.

Figure 5:
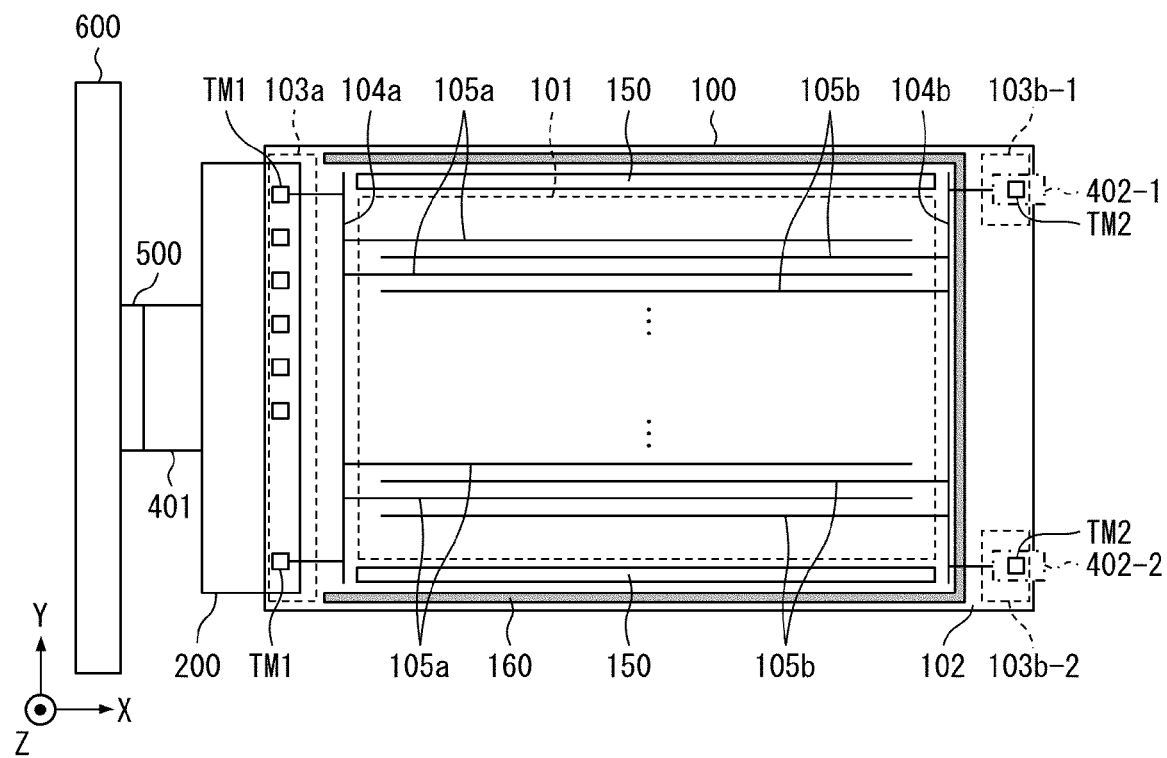
FIG. 5 is a plan view schematically illustrating the configuration of the display device according to the first embodiment.

Now, with reference to (a) and (b) of FIG. 4 and FIG. 5, description will be given of the paths R1 and R2 through which the high power supply voltage output from the high power supply voltage source 700 is fed to the first high power supply trunk wiring line 104*a* and the second high power supply trunk wiring line 104*b*. FIG. 5 is a plan view illustrating, in further detail, a schematic plan view of the display device according to the present embodiment illustrated in (b) of FIG. 4. Note that, as illustrated in FIG. 5, the display device according to the present embodiment includes a gate driver monolithic circuit 150 formed in the non-display region 102. A gate signal is input from the gate driver monolithic circuit 150 towards the display region 101. A signal for driving the gate driver monolithic circuit 150 is fed from the chip on film 200 on which the source driver 300 is mounted.

As illustrated in (a) and (b) of FIG. 4, the high power supply voltage source 700 is mounted on the motherboard 600 located outside the display device according to the present embodiment. The flexible substrate 401 is connected at one end to the motherboard 600 via a connector 500, with the chip on film 200 mounted at the other end of the flexible substrate 401. The chip on film 200 is mounted in the first terminal region 103*a* of the display panel 100. The connection between the chip on film 200 and the first terminal region 103*a* is specifically achieved by connecting a terminal included in the chip on film 200 and two terminal portions TM1 provided in the first terminal region 103*a*, as illustrated in FIG. 5. One of the terminal portions TM1 is connected to one end of the first high power supply trunk wiring line 104*a* via a wiring line formed in the non-display region 102. Similarly, the other terminal portion TM1 is connected to the other end of the first high power supply trunk wiring line 104*a* via wiring line formed in the non-display region 102. Note that, in FIG. 5, a plurality of terminal portions other than the above-described terminal portions TM1 are provided and used to exchange various signals and data signals between the chip on film 200 and the display panel 100.

As a result, the high power supply voltage output from the high power supply voltage source 700 is fed to the first high power supply trunk wiring line 104a via the path R1 from the connector 500 through the flexible substrate 401, the chip on film 200, and the first terminal region 103a.

On the other hand, the flexible cable 402 provided on the flexible substrate 401 extends along the back face side of the chip on film 200 and the back face of the display panel 100 in the positive direction of the X axis in (a) and (b) of FIG. 4, and is bent toward the front face side of the display panel 100 near the end portion of the display panel 100 opposite to the end portion side on which the chip on film 200 is mounted. A tip portion of the flexible cable 402 is connected to the second terminal region 103b of the display panel 100.

The flexible cable 402 includes a first flexible cable 402-1 and a second flexible cable 402-2, and the second terminal region 103b includes a second-first terminal region 103b-1 and a second-second terminal region 103b-2. The connection between the first flexible cable 402-1 and the second-first terminal region 103b-1 is specifically achieved by connecting a terminal included in the first flexible cable 402-1 to a terminal portion TM2 provided in the second-first terminal region 103b-1, as illustrated in FIG. 5. Similarly, the connection between the second flexible cable 402-2 and the second-second terminal region 103b-2 is achieved by connecting a terminal included in the second flexible cable 402-2 to a terminal portion TM2 provided in the second-second terminal region 103b-2. The terminal portion TM2 provided in the second-first terminal region 103b-1 is connected to one end of the second high power supply trunk wiring line 104b via a wiring line formed in the non-display region 102. Similarly, the terminal portion TM2 provided in the second-second terminal region 103b-2 is connected to the other end of the second high power supply trunk wiring line 104b via a wiring line formed in the non-display region 102.

Thus, the high power supply voltage output from the high power supply voltage source 700 is fed to the second high power supply trunk wiring line 104b via the path R2 from the connector 500 through the flexible substrate 401, the flexible cable 402, and the second terminal region 103b.

It should be noted that, as illustrated in FIG. 5, a low power supply voltage line 160 formed in the non-display region 102 is formed of the same wiring line layer as that included in each terminal portion TM2 and the second high power supply trunk wiring line 104b and thus that the wiring line connecting each terminal portion TM2 to the second high power supply trunk wiring line 104b is formed of a wiring line layer different from the wiring line layer included in each terminal portion TM2, the second high power supply trunk wiring line 104b, and the low power supply voltage line 160. This wiring line structure will be described below.

Modification Example 1

Figure 6:
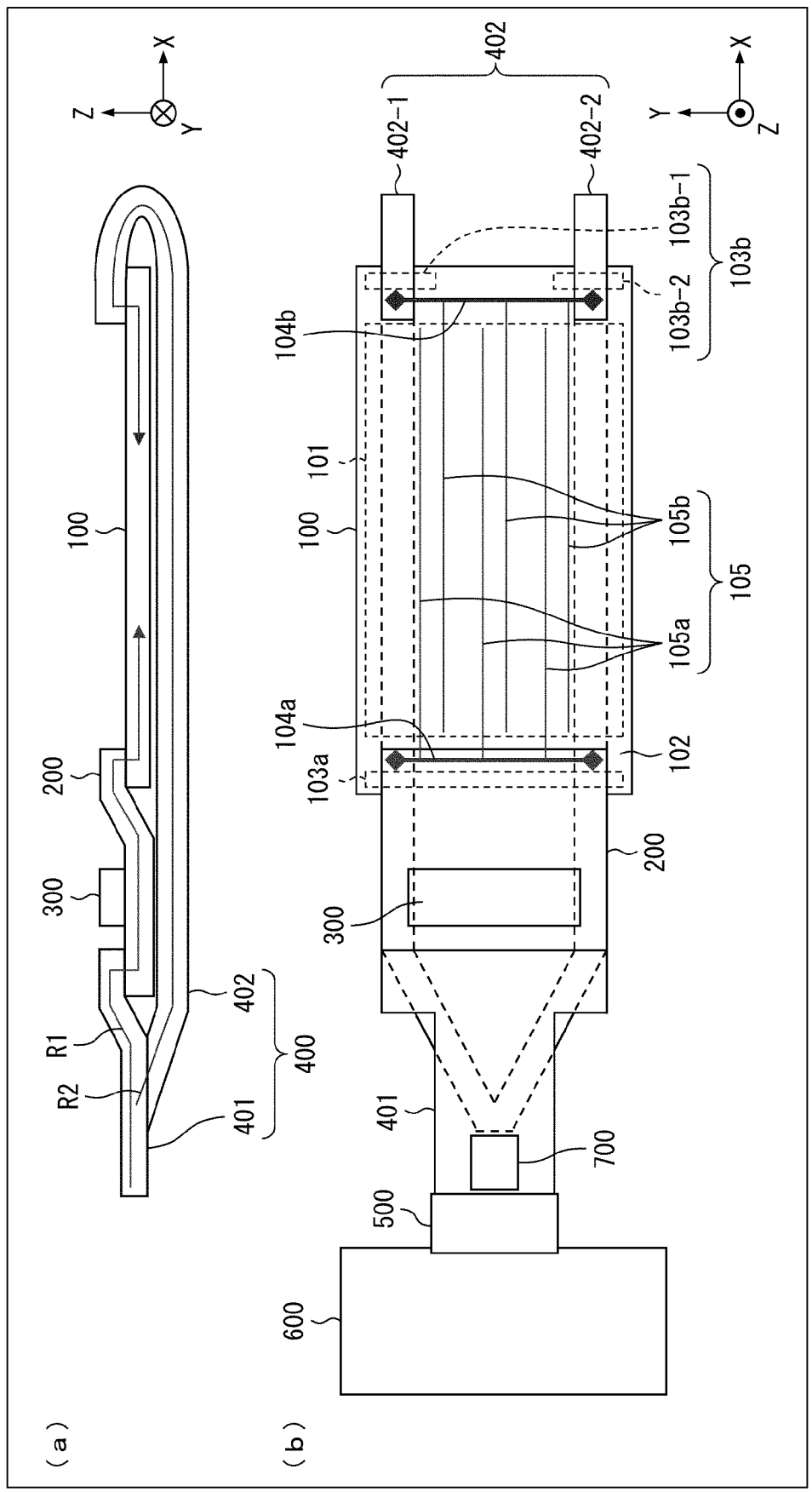
FIG. 6($a$) is a cross-sectional view schematically illustrating another configuration of the display device according to the first embodiment.

(a) of FIG. 6 is a cross-sectional view schematically illustrating another configuration of the display device according to the first embodiment of the disclosure. (b) of FIG. 6 is a plan view schematically illustrating the another configuration of the display device.

The display device according to Modification Example 1 differs from the display device according to the first embodiment described above in that the high power supply voltage source 700 is mounted on the flexible substrate 401.

In the display device according to Modification Example 1, the high power supply voltage output from the high power supply voltage source 700 is fed from the flexible substrate 401 via the paths R1 and R2 to the first high power supply trunk wiring line 104a and the second high power supply trunk wiring line 104b, similar to the display device according to the first embodiment.

Modification Example 2

Figure 7:
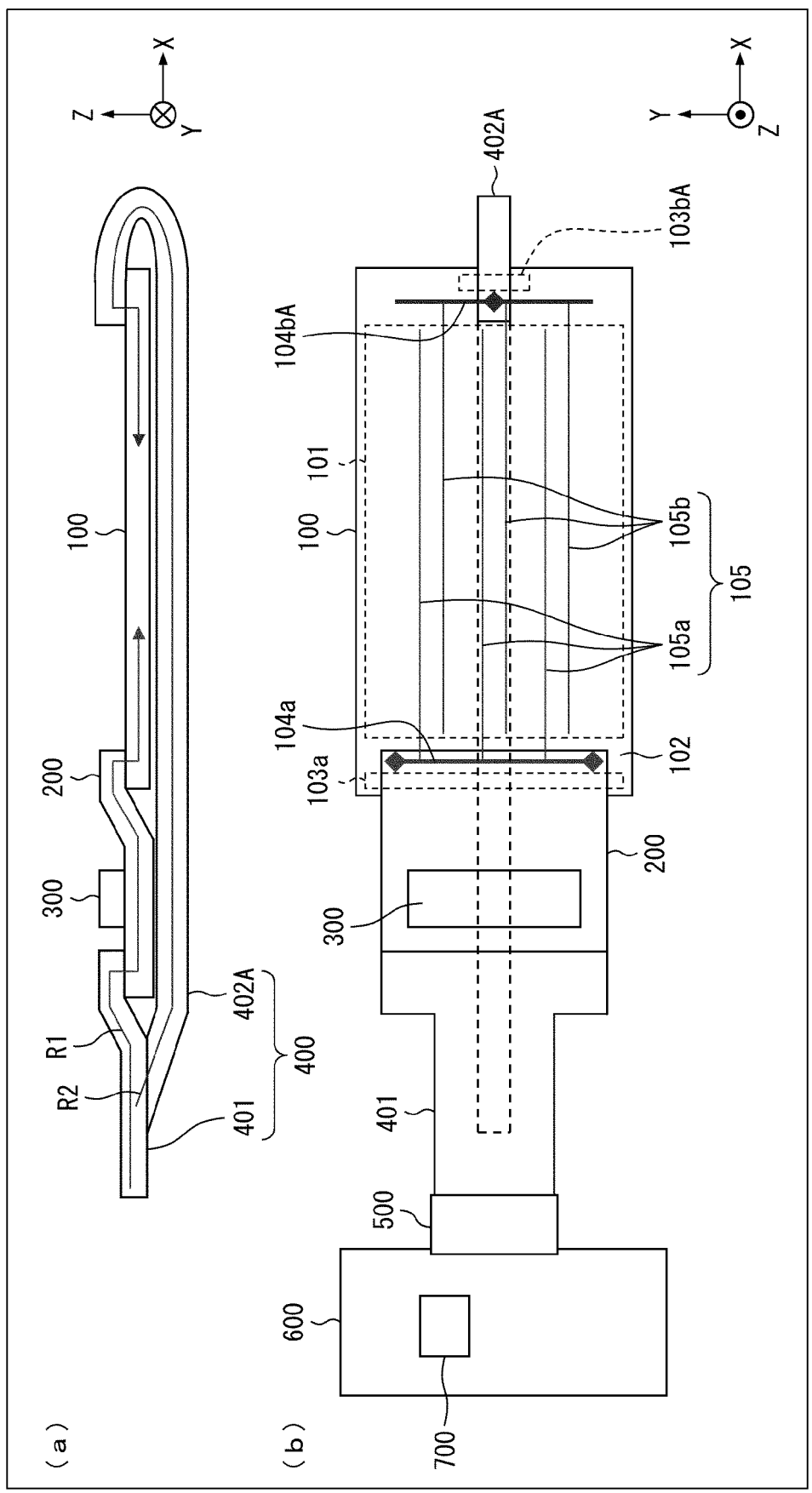
FIG. 7($a$) is a cross-sectional view schematically illustrating another configuration of the display device according to the first embodiment.

(a) of FIG. 7 is a cross-sectional view schematically illustrating another configuration of the display device according to the first embodiment of the disclosure. (b) of FIG. 7 is a plan view schematically illustrating the another configuration of the display device.

The display device according to Modification Example 2 differs from the display device according to the first embodiment described above in that a flexible cable 402A is provided on the flexible substrate 401 instead of the flexible cable 402 (the first flexible cable 402-1 and the second flexible cable 402-2).

In the display device according to the first embodiment described above, as illustrated in (b) of FIG. 4, the flexible cable 402 includes a first flexible cable 402-1 and a second flexible cable 402-2, and the first flexible cable 402-1 extends along a back face of an end portion of the display panel 100 on one end side of the second high power supply trunk wiring line 104b, and the second flexible cable 402-2 extends along a back face of an end portion of the display panel 100 on the other end side of the second high power supply trunk wiring line 104b.

In contrast, in the display device according to Modification Example 2, as illustrated in (b) of FIG. 7, the flexible cable 402A does not extend along the back faces of both end portions of the display panel 100, unlike in the first embodiment. In the display device according to Modification Example 2, the display device extends along the back face of a central portion of the display panel 100. The flexible cable 402A is bent toward the front face side of the display panel 100 near the end portion of the display panel 100 opposite to the end portion side on which chip on film 200 is mounted, and the tip portion of the flexible cable 402A is connected to a second terminal region 103bA of the display panel 100.

The connection between the flexible cable 402A and the second terminal region 103bA is achieved by connecting a terminal included in the flexible cable 402A to a terminal portion provided in the second terminal region 103bA. The terminal portion provided in the second terminal region 103bA is connected to the central portion of the second high power supply trunk wiring line 104bA via a wiring line formed in the non-display region 102.

Modification Example 3

Figure 8:
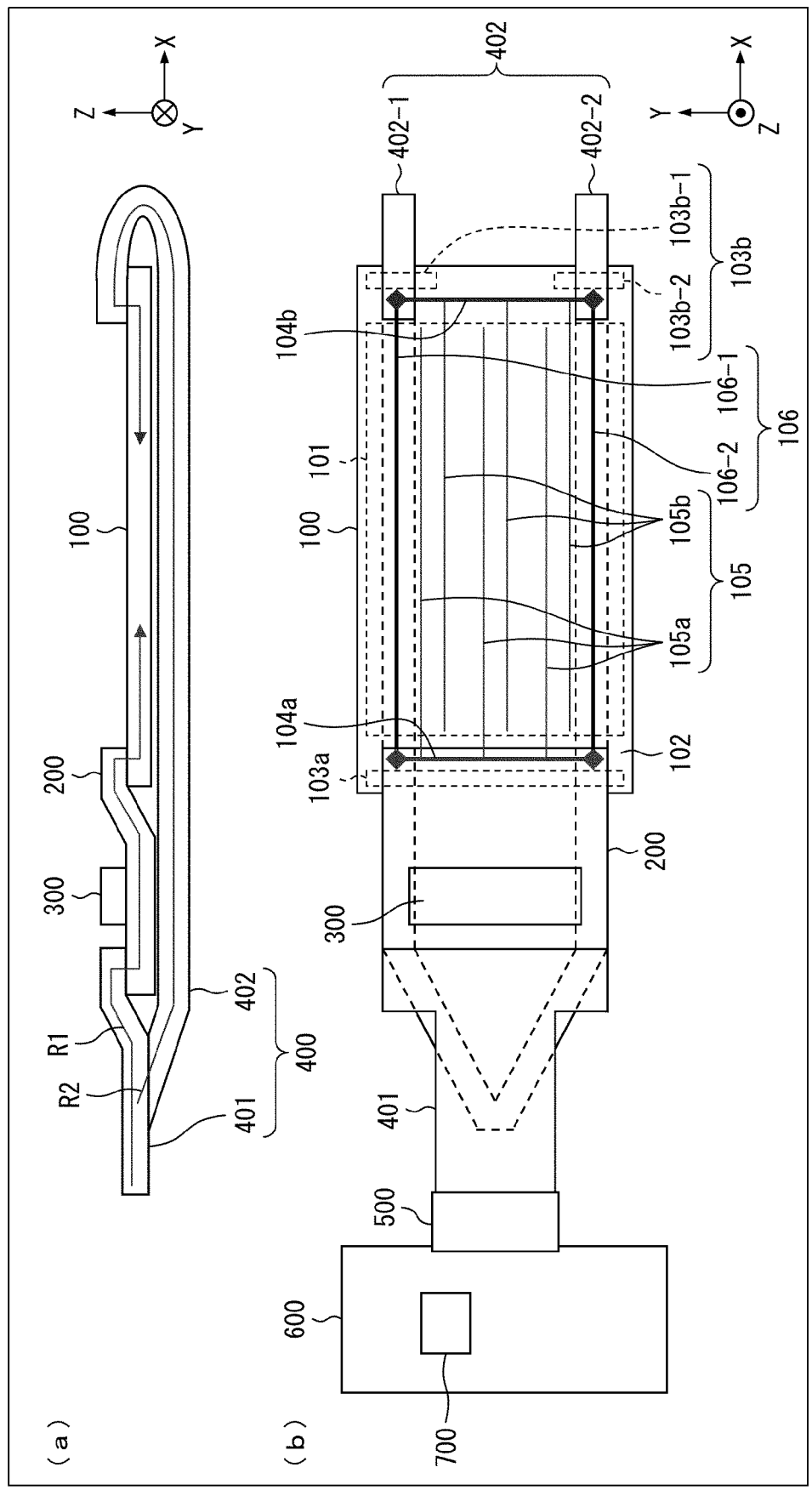
FIG. 8($a$) is a cross-sectional view schematically illustrating another configuration of the display device according to the first embodiment.

(a) of FIG. 8 is a cross-sectional view schematically illustrating another configuration of the display device according to the first embodiment of the disclosure. (b) of FIG. 8 is a plan view schematically illustrating the another configuration of the display device.

The display device according to Modification Example 3 differs from the display device according to the first embodiment described above in that the display device according to Modification Example 3 includes a connection wiring line 106 connecting the first high power supply trunk wiring line 104a to the second high power supply trunk wiring line 104b. Specifically, the connection wiring line 106 includes a first connection wiring line 106-1 and a second connection wiring line 106-2, and as illustrated in (b) of FIG. 8, one end of the first high power supply trunk wiring line 104a is connected to one end of the second high power supply trunk wiring line 104b via the first connection wiring line 106-1. The other end of the first high power supply trunk wiring line 104a is connected to the other end of the second high power supply trunk wiring line 104b via the second connection wiring line 106-2.

Each of the first connection wiring line 106-1 and the second connection wiring line 106-2 has substantially the same wiring line width as that of each of the first high power supply trunk wiring line 104a and the second high power supply trunk wiring line 104b. Each of the first connection wiring line 106-1 and the second connection wiring line 106-2 offers substantially the same wiring line resistance as that of each of the first high power supply trunk wiring line 104a and the second high power supply trunk wiring line 104b. Thus, the Ir-Drop generated in the first connection wiring line 106-1 and the second connection wiring line 106-2 is at a negligible level compared to the Ir-Drop generated in each of the first high power supply voltage lines 105a and the second high power supply voltage line 105b. Thus, the display device according to Modification Example 3 forms high power supply trunk wiring lines in a frame shape including the first connection wiring line 106-1, the second connection wiring line 106-2, the first high power supply trunk wiring line 104a, and the second high power supply trunk wiring line 104b disposed in the non-display region 102 enclosing the display region 101.

Modification Example 4

Figure 9:
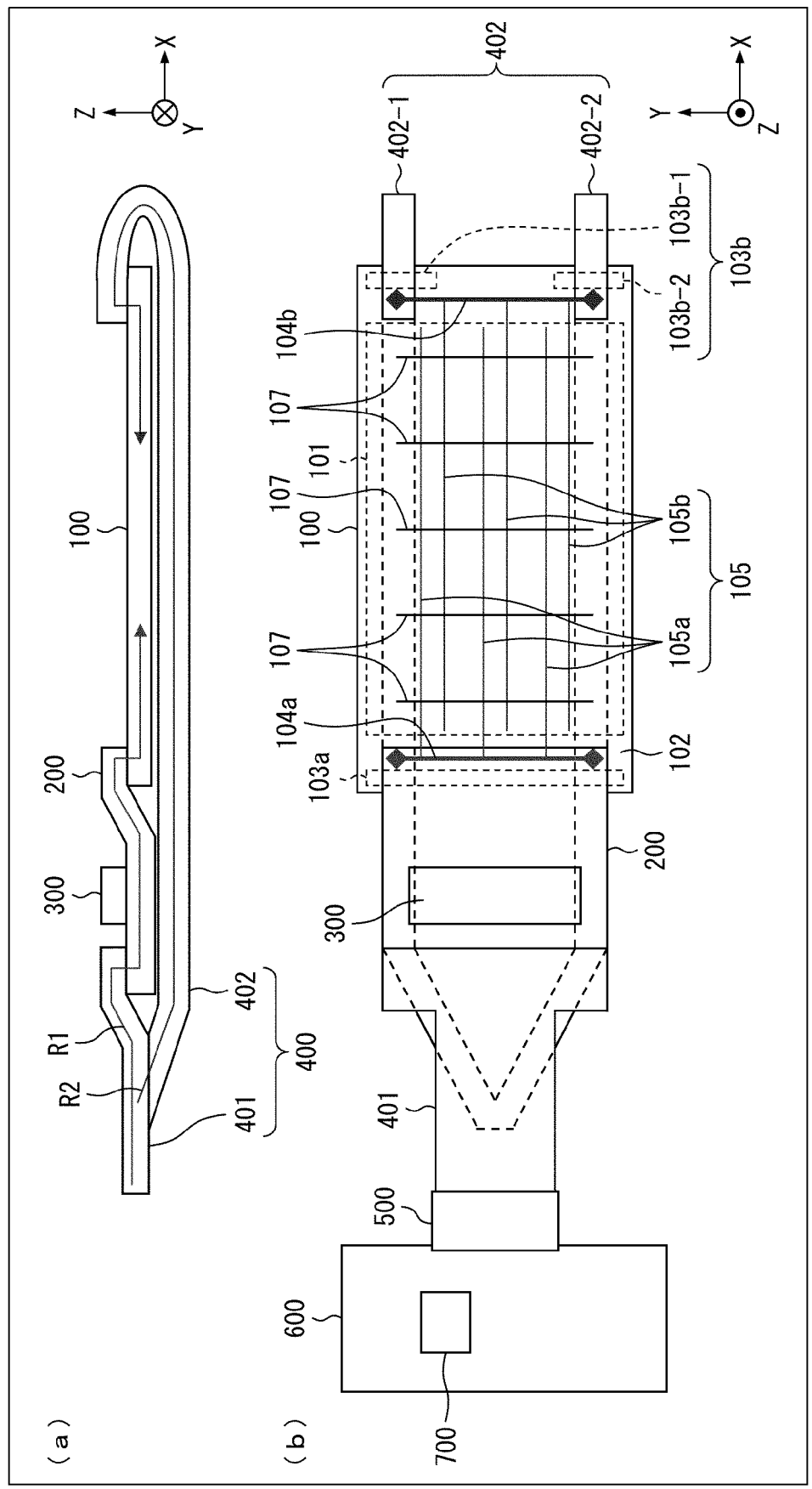
FIG. 9($a$) is a cross-sectional view schematically illustrating another configuration of the display device according to the first embodiment.

(a) of FIG. 9 is a cross-sectional view schematically illustrating another configuration of the display device according to the first embodiment of the disclosure. (b) of FIG. 9 is a plan view schematically illustrating the another configuration of the display device.

The display device according to Modification Example 4 differs from the display device according to the first embodiment described above in that the display device according to Modification Example 4 includes a plurality of third high power supply voltage lines 107 extending in the direction of the Y axis in (b) of FIG. 9 and intersecting the first high power supply voltage lines 105a and the second high power supply voltage lines 105b.

At intersections where each of the third high power supply voltage lines 107 intersects the first high power supply voltage lines 105a and the second high power supply voltage lines 105b, the third high power supply voltage line 107 is connected to the first high power supply voltage lines 105a and the second high power supply voltage lines 105b.

Each of the third high power supply voltage lines 107 has substantially the same wiring line width as that of each of the first high power supply voltage lines 105a and the second high power supply voltage line 105b. Each of the third high power supply voltage lines 107 offers substantially the same wiring line resistance as that of each of the first high power supply voltage lines 105a and the second high power supply voltage line 105b. Thus, the display device according to Modification Example 4 forms high power supply voltage lines in a lattice pattern including the first high power supply voltage lines 105a, the second high power supply voltage lines 105b, and the third high power supply voltage lines 107 disposed in the display region 101.

Arrangement Configuration of First High Power Supply Voltage Lines and Second High Power Supply Voltage Lines Hereinafter, the arrangement configuration of the first high power supply voltage lines 105a and the second high power supply voltage lines 105b will be described with reference to FIGS. 10 to 17.

1. RGB Arrangement

Figure 10:
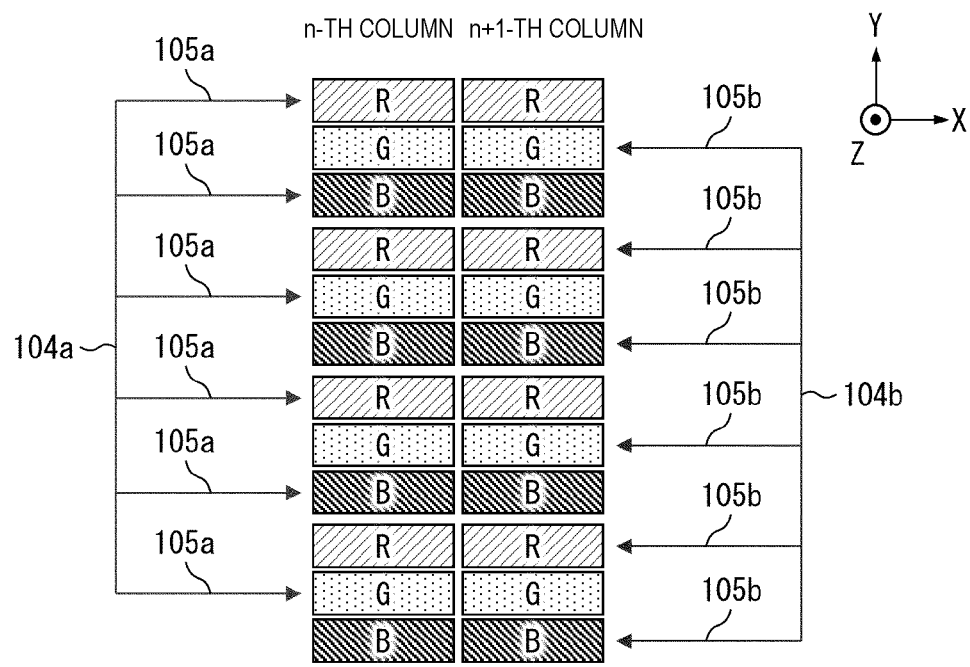
FIG. 10 is a plan view schematically illustrating an example of an arrangement configuration of a first high power supply voltage line and a second high power supply voltage line.

FIG. 10 is a plan view schematically illustrating an example of an arrangement configuration of the first high power supply voltage lines 105a and the second high power supply voltage lines 105b for a plurality of subpixels in an RGB arrangement. Note that FIGS. 10 to 17 representatively illustrate some of the subpixels included in the n-th column and some of the subpixel included in the n+1-th column.

In the example illustrated in FIG. 10, the first high power supply voltage lines 105a are connected to the subpixels included in odd-numbered rows, while the second high power supply voltage lines 105b are connected to the subpixels included in even-numbered rows.

Note that, in the example illustrated in FIG. 10, the subpixels are arranged in the order of the red subpixel (R)→the green subpixel (G)→the blue subpixel (B)→the red subpixel (R), . . . , but that the limitation to this order is not intended.

Additionally, in FIG. 10, the first high power supply voltage lines 105a and the second high power supply voltage lines 105b are alternately connected to the respective rows, but the first high power supply voltage lines 105a and the second high power supply voltage lines 105b may be alternately connected to the respective rows at the intervals of a plurality of rows such as two or three rows.

Figure 11:
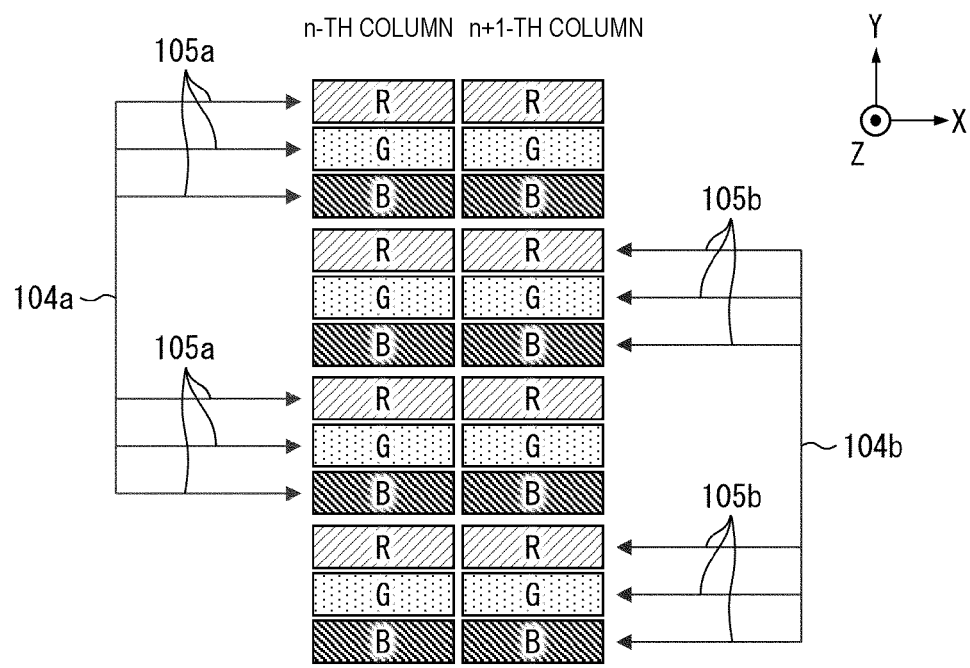
FIG. 11 is a plan view schematically illustrating another example of the arrangement configuration of the first high power supply voltage line and the second high power supply voltage line.
Figure 12:
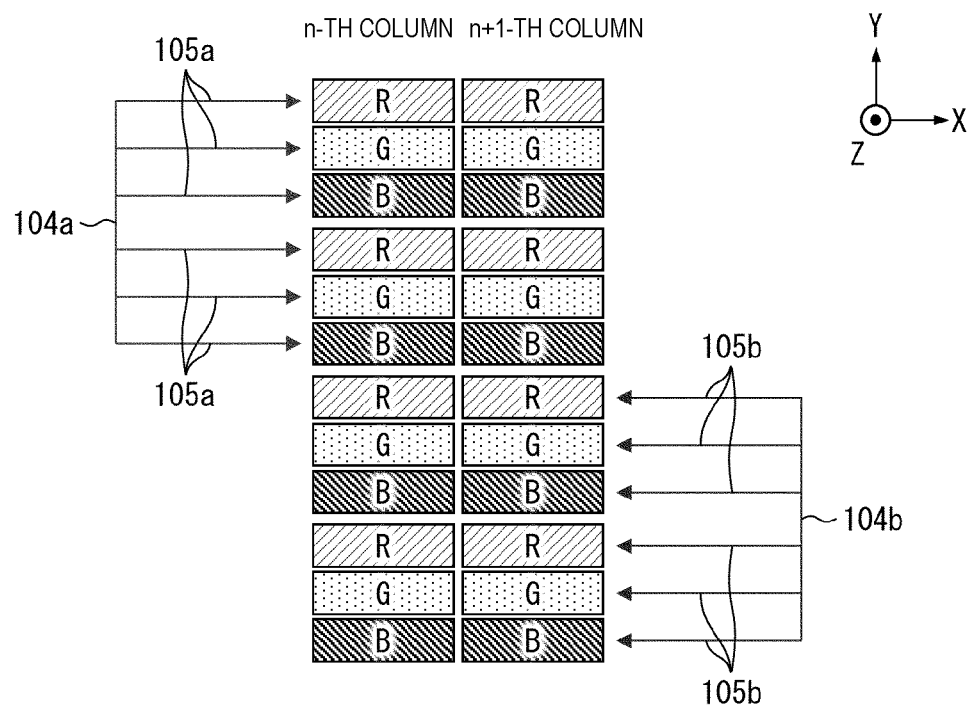
FIG. 12 is a plan view schematically illustrating another example of the arrangement configuration of the first high power supply voltage line and the second high power supply voltage line.

FIG. 11 is a plan view schematically illustrating an example of an arrangement configuration of the first high power supply voltage lines 105a and the second high power supply voltage lines 105b for a plurality of subpixels in an RGB arrangement.

In the example illustrated in FIG. 11, the first high power supply voltage lines 105a are connected to the pixels included in the odd-numbered rows, whereas the second high power supply voltage lines 105b are connected to the pixels included in the even-numbered rows. Here, in FIG. 11, "pixel" refers to a pixel including a red subpixel (R), a green subpixel (G), and a blue subpixel (B). "Row" refers to a row including a plurality of pixels, and is a concept different from a row including a plurality of subpixels illustrated in FIG. 10.

Note that in the example illustrated in FIG. 11, the subpixels are arranged in the order of the red subpixel (R)→the green subpixel (G)→the blue subpixel (B)→the red subpixel (R), . . . , but that the limitation to this order is not intended.

Additionally, in the example illustrated in FIG. 11, the first high power supply voltage lines 105a and the second high power supply voltage lines 105b are alternately connected to the respective rows, but the first high power supply voltage lines 105a and the second high power supply voltage lines 105b may be alternately connected to the respective rows at the intervals of a plurality of rows such as two rows (see FIG. 12) or three rows.

2. Pentile Arrangement

Figure 13:
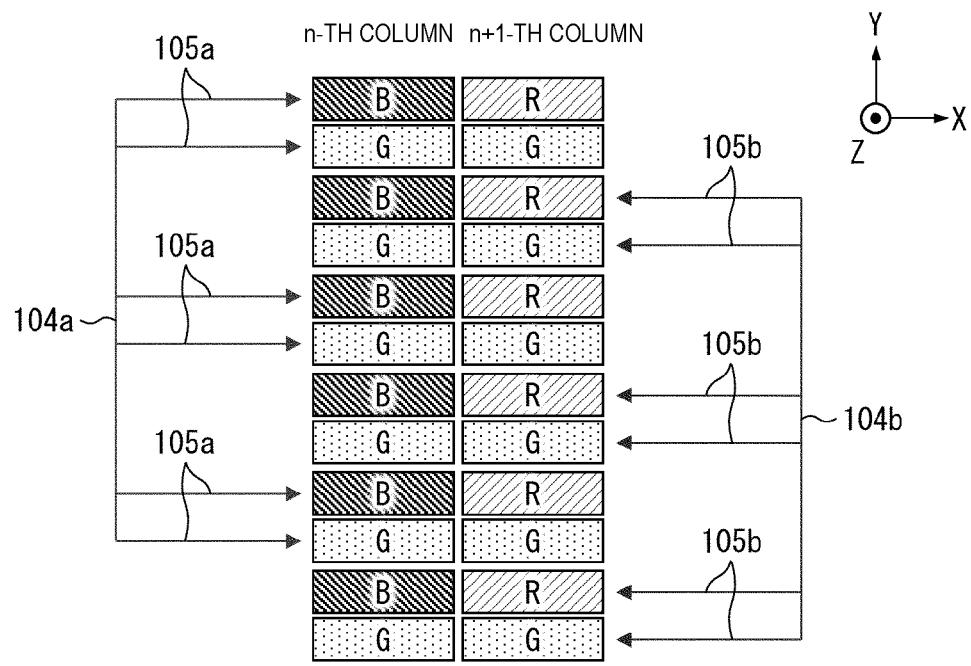
FIG. 13 is a plan view schematically illustrating another example of the arrangement configuration of the first high power supply voltage line and the second high power supply voltage line.

FIG. 13 is a plan view schematically illustrating an example of an arrangement configuration of the first high power supply voltage lines 105a and the second high power supply voltage lines 105b for a plurality of subpixels in a Pentile arrangement. In the Pentile arrangement, unlike in the RGB arrangement illustrated in FIGS. 10 to 12, the "pixel" includes the red subpixel (R) and the green subpixel (G), or the blue subpixel (B) and the green subpixel (G). In the Pentile arrangement, as illustrated in FIG. 13, pixels each including the blue subpixel (B) and the green subpixel (G) and pixels each including the red subpixel (R) and the green subpixel (G) are alternately arranged along the row direction of the subpixels (the direction of the X axis in FIG. 13). In other words, in the Pentile arrangement, rows in which the blue subpixels (B) and the red subpixels (R) are alternately arranged and rows in which the green subpixels (G) are contiguously arranged are alternately arranged along the column direction of the subpixels (the direction of the Y axis in FIG. 13).

In the example illustrated in FIG. 13, the first high power supply voltage lines 105*a* are connected to the pixels included in the odd-numbered rows, whereas the second high power supply voltage lines 105*b* are connected to the pixels included in the even-numbered rows.

Note that, in the example illustrated in FIG. 13, the subpixels are arranged along the column direction of the subpixels in the order of the blue subpixel (B)→the green subpixel (G)→the blue subpixel (B), . . . , or the red subpixel (R)→the green subpixel (G)→the red subpixel (R), . . . , but that the limitation to this order is not intended.

Additionally, in an example illustrated in FIG. 13, the first high power supply voltage lines 105*a* and the second high power supply voltage lines 105*b* are alternately connected to the respective rows, but the first high power supply voltage lines 105*a* and the second high power supply voltage lines 105*b* may be alternately connected to the respective rows at the intervals of a plurality of rows such as two or three rows.

3. RGBW Arrangement

Figure 14:
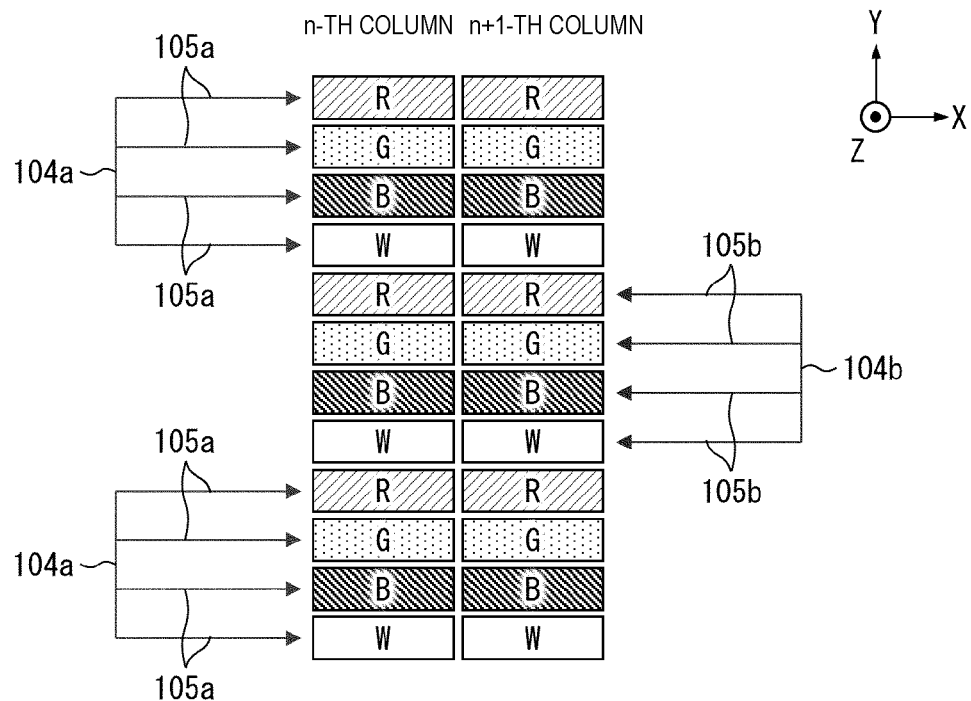
FIG. 14 is a plan view schematically illustrating another example of the arrangement configuration of the first high power supply voltage line and the second high power supply voltage line.

FIG. 14 is a plan view schematically illustrating an example of an arrangement configuration of the first high power supply voltage lines 105*a* and the second high power supply voltage lines 105*b* for a plurality of subpixels in an RGBW arrangement. In the RGBW arrangement, unlike in the RGB arrangement illustrated in FIGS. 10 to 12 or the Pentile arrangement illustrated in FIG. 13, the "pixel" includes the red subpixel (R), the green subpixel (G), the blue subpixel (B), and a white subpixel (W) (no arrangement of a color filter).

In the example illustrated in FIG. 14, the first high power supply voltage lines 105*a* are connected to the pixels included in the odd-numbered rows, whereas the second high power supply voltage lines 105*b* are connected to the pixels included in the even-numbered rows.

Note that, in the example illustrated in FIG. 14, the subpixels are arranged along the column direction of the subpixels in the order of red subpixel (R)→green subpixel (G)→blue subpixel (B)→white subpixel (W)→red subpixel (R), . . . , but that the limitation to this order is not intended.

Additionally, in an example illustrated in FIG. 14, the first high power supply voltage lines 105*a* and the second high power supply voltage lines 105*b* are alternately connected to the respective rows, but the first high power supply voltage lines 105*a* and the second high power supply voltage lines 105*b* may be alternately connected to the respective rows at the intervals of a plurality of rows such as two or three rows.

4. Delta Arrangement

Figure 15:
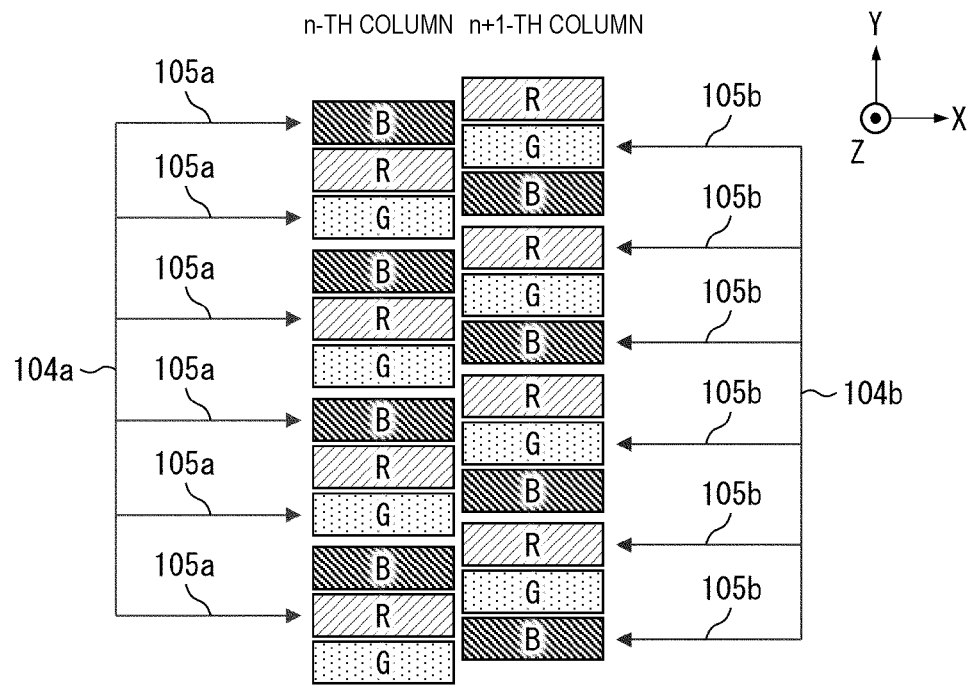
FIG. 15 is a plan view schematically illustrating another example of the arrangement configuration of the first high power supply voltage line and the second high power supply voltage line.

FIG. 15 is a plan view schematically illustrating an example of an arrangement configuration of the first high power supply voltage lines 105*a* and the second high power supply voltage lines 105*b* for a plurality of subpixels in a Delta arrangement. In the Delta arrangement, as illustrated in FIG. 15, with the subpixels included in each row focused on, subpixels adjacent to each other are disposed offset by 0.5 w (w: subpixel width) along the column direction of the subpixels (the direction of the Y axis in FIG. 15).

In the example illustrated in FIG. 15, the first high power supply voltage lines 105*a* are connected to the subpixels included in the odd-numbered rows, whereas the second high power supply voltage lines 105*b* are connected to the subpixels included in the even-numbered rows.

Note that, in the example illustrated in FIG. 15, the subpixels are arranged in the order of the red subpixel (R)→the green subpixel (G)→the blue subpixel (B)→the red subpixel (R), . . . , but that the limitation to this order is not intended.

In FIG. 15, the first high power supply voltage lines 105*a* and the second high power supply voltage lines 105*b* are alternately connected the respective rows on a row-by-row basis, but the first high power supply voltage lines 105*a* and the second high power supply voltage lines 105*b* may be alternately connected to the respective rows at the intervals of a plurality of rows such as two or three rows.

Figure 16:
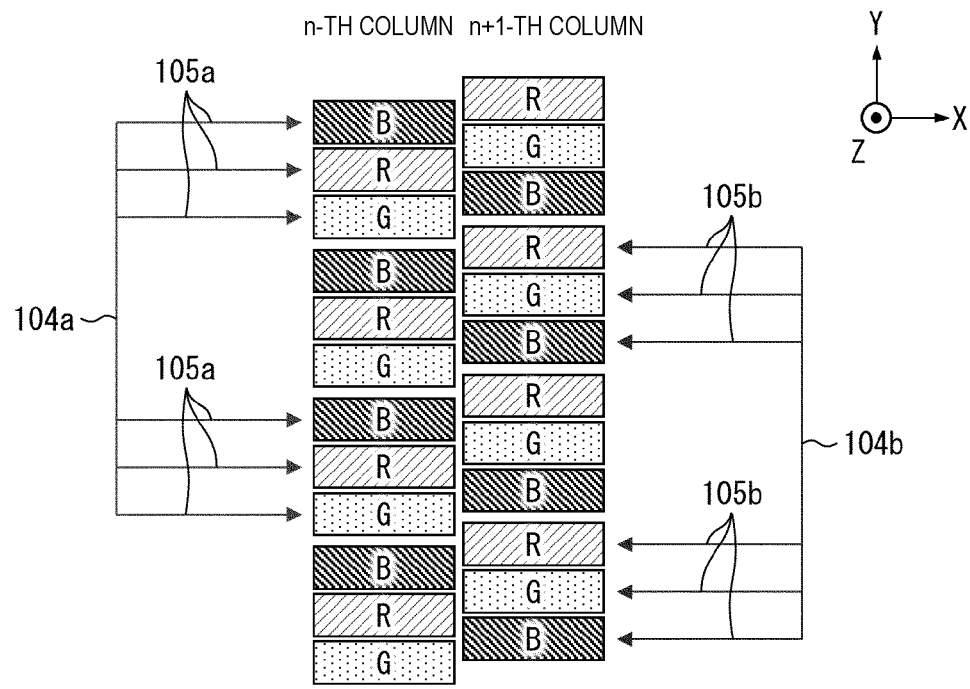
FIG. 16 is a plan view schematically illustrating another example of the arrangement configuration of the first high power supply voltage line and the second high power supply voltage line.
Figure 17:
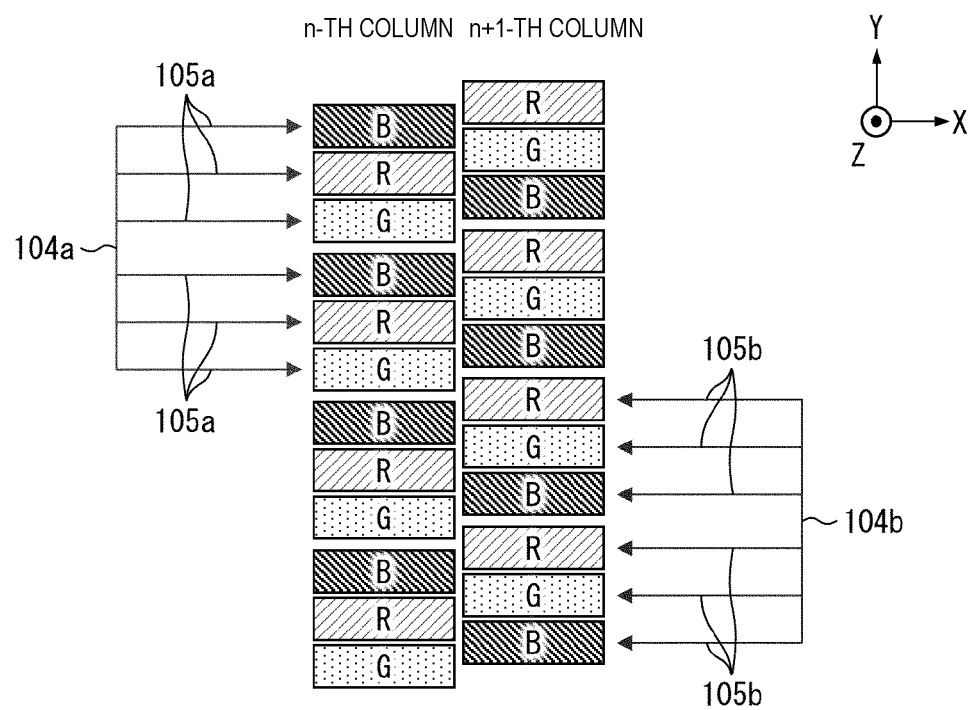
FIG. 17 is a plan view schematically illustrating another example of the arrangement configuration of the first high power supply voltage line and the second high power supply voltage line.

FIG. 16 is a plan view schematically illustrating an example of an arrangement configuration of the first high power supply voltage lines 105*a* and the second high power supply voltage lines 105*b* for a plurality of subpixels in a Delta arrangement.

In the example illustrated in FIG. 16, the first high power supply voltage lines 105*a* are connected to the pixels included in the odd-numbered rows, whereas the second high power supply voltage lines 105*b* are connected to the pixels included in the even-numbered rows. Here, in FIG. 16, "pixel" refers to a pixel including the red subpixel (R), the green subpixel (G), and the blue subpixel (B). "Row" refers to a row including a plurality of pixels, and is a concept different from the row including a plurality of subpixels illustrated in FIG. 15. In this case as well, with the pixels included in each row focused on, pixels adjacent to each other are disposed offset by 0.5 w along the column direction of the pixels (the direction of the Y axis in FIG. 16).

Note that, in the example illustrated in FIG. 16, the subpixels are arranged in the order of the red subpixel (R)→the green subpixel (G)→the blue subpixel (B)→the red subpixel (R), . . . , but that the limitation to this order is not intended.

In the example illustrated in FIG. 16, the first high power supply voltage lines 105*a* and the second high power supply voltage lines 105*b* are alternately connected the respective rows on a row-by-row basis, but the first high power supply voltage lines 105*a* and the second high power supply voltage lines 105*b* may be alternately connected to the respective rows at the intervals of a plurality of rows such as two rows (see FIG. 17) or three rows.

Figure 18:
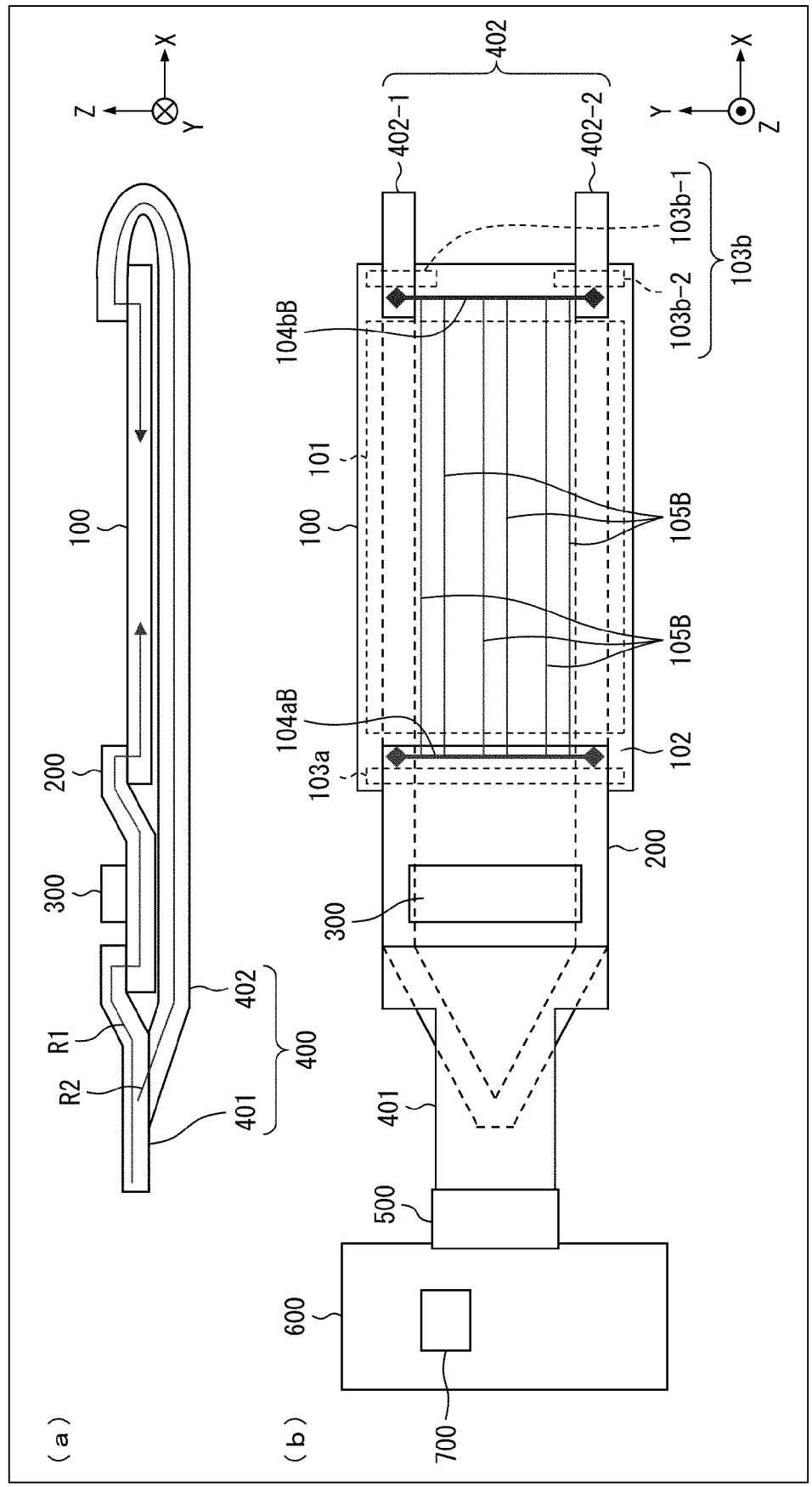
FIG. 18($a$) is a cross-sectional view schematically illustrating a configuration of a display device according to a second embodiment.

Second Embodiment (a) of FIG. 18 is a cross-sectional view schematically illustrating a schematic of a configuration of a display device according to a second embodiment of the disclosure, and (b) of FIG. 18 is a plan view schematically illustrating a schematic of a configuration of the display device.

A point where the display device according to the second embodiment differs from the display device according to the first embodiment is that the plurality of high power supply voltage lines 105*b* is connected to both the first high power supply trunk wiring line 104*a*B and the second high power supply trunk wiring line 104*b*B.

In the display device according to the second embodiment, the plurality of high power supply voltage lines 105*b* are connected to both the first high power supply trunk wiring line 104aB and the second high power supply trunk wiring line 104bB, a high power supply voltage is fed to both the first high power supply trunk wiring line 104aB and the second high power supply trunk wiring line 104bB.

Modification Example 1

Figure 19:
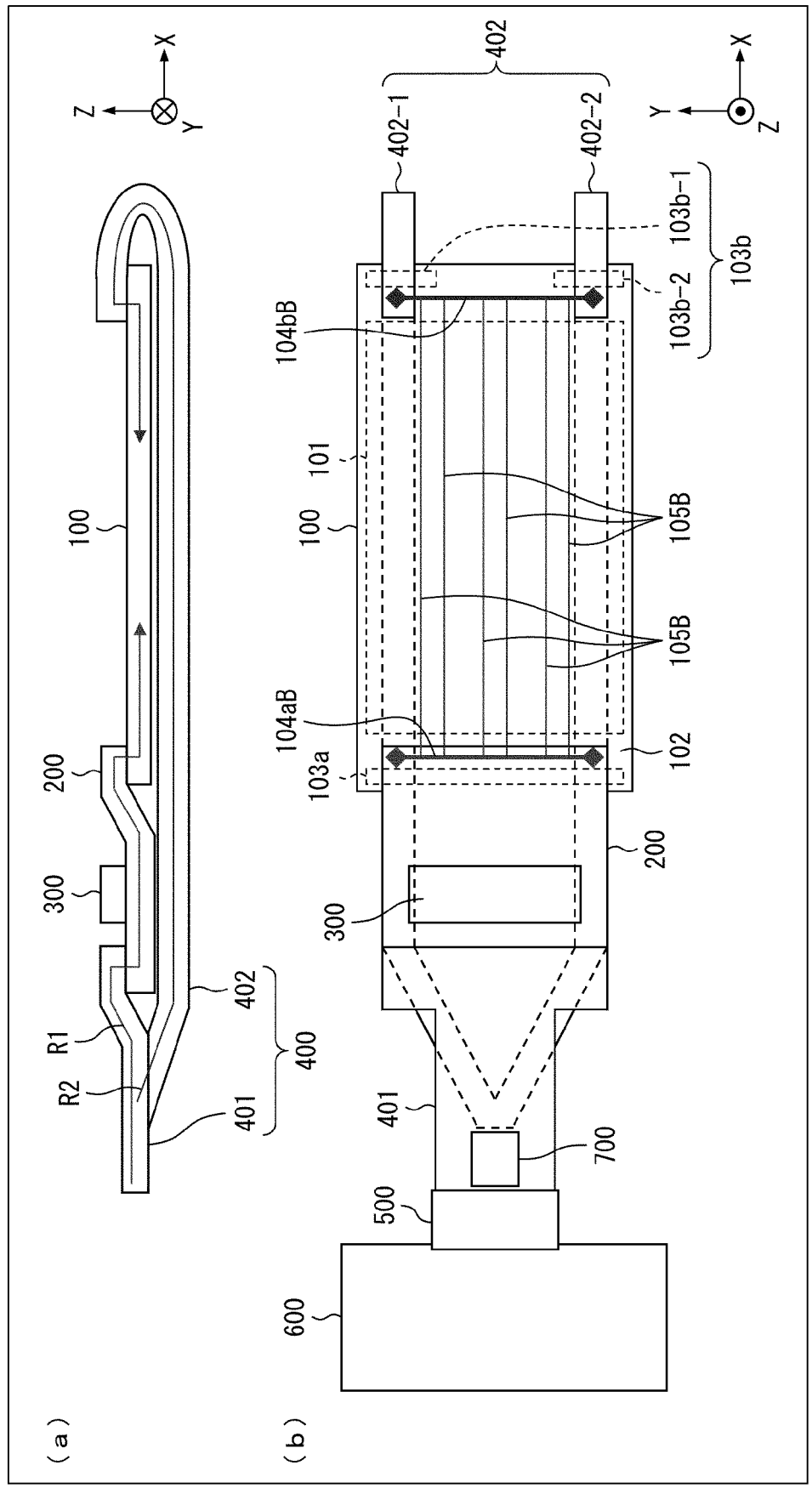
FIG. 19(a) is a cross-sectional view schematically illustrating another configuration of the display device according to the second embodiment.
FIG. 19(b) is a plan view schematically illustrating the another configuration of the display device according to the second embodiment.

(a) of FIG. 19 is a cross-sectional view schematically illustrating another configuration of the display device according to the second embodiment of the disclosure. (b) of FIG. 19 is a plan view schematically illustrating another configuration of the display device.

The display device according to the first Modification Example differs from the display device according to the second embodiment described above in that the high power supply voltage source 700 is mounted on the flexible substrate 401.

In the display device according to the first Modification Example, the high power supply voltage output from the high power supply voltage source 700 is fed from the flexible substrate 401 via the paths R1 and R2 to the first high power supply trunk wiring line 104aB and the second high power supply trunk wiring line 104bB, similar to the display device according to the second embodiment.

Modification Example 2

Figure 20:
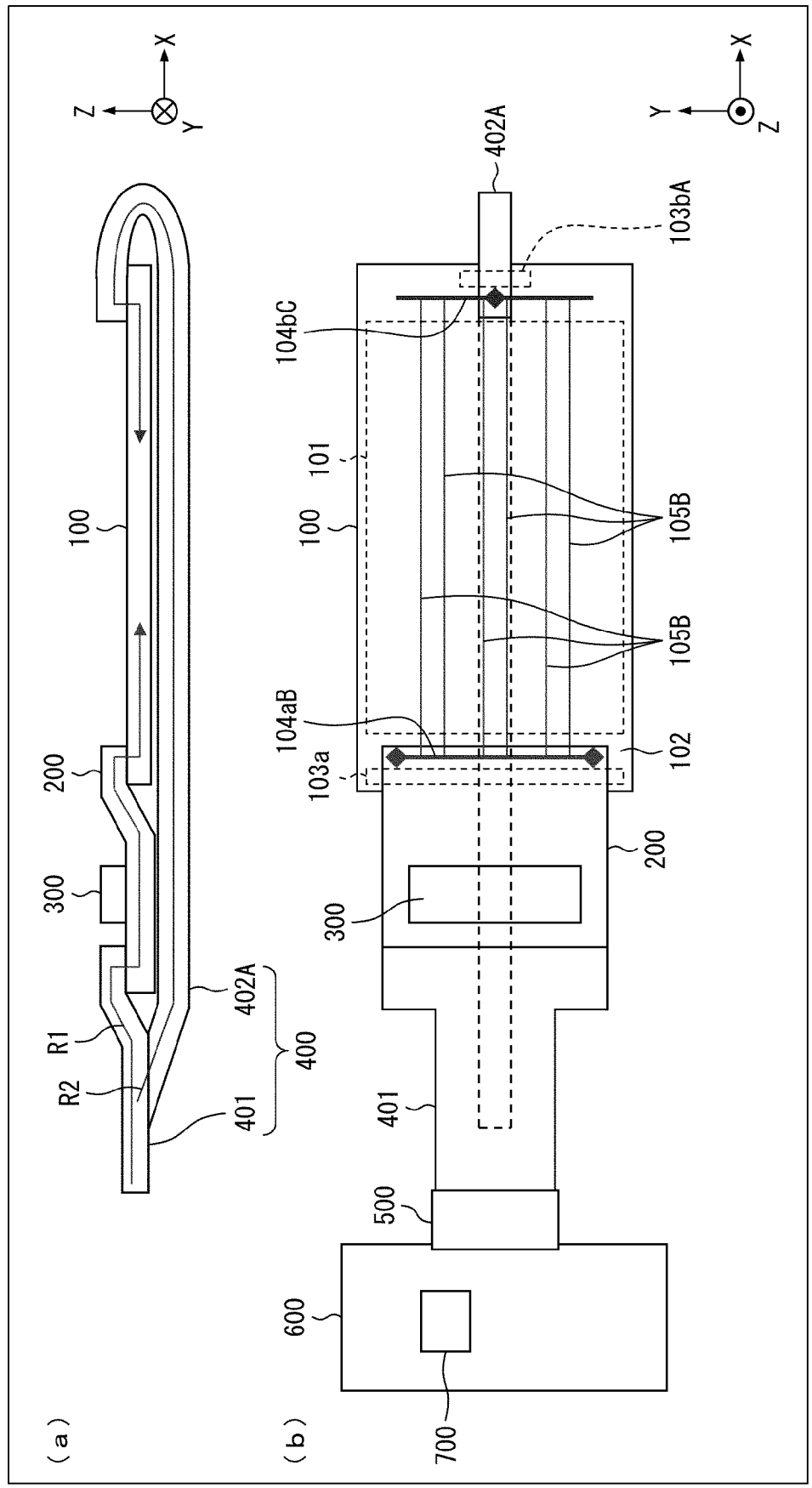
FIG. 20(a) is a cross-sectional view schematically illustrating another configuration of the display device according to the second embodiment.
FIG. 20(b) is a plan view schematically illustrating the another configuration of the display device according to the second embodiment.

(a) of FIG. 20 is a cross-sectional view schematically illustrating another configuration of the display device according to the second embodiment of the disclosure. (b) of FIG. 20 is a plan view schematically illustrating another configuration of the display device.

The display device according to Modification Example 2 differs from the display device according to the second embodiment described above in that a flexible cable 402A is provided on the flexible substrate 401 instead of the flexible cable 402 (the first flexible cable 402-1 and the second flexible cable 402-2).

A terminal portion provided in the second terminal region 103bA and the central portion of the second high power supply trunk wiring line 104bC are connected via wiring line formed in the non-display region 102.

Figure 21:
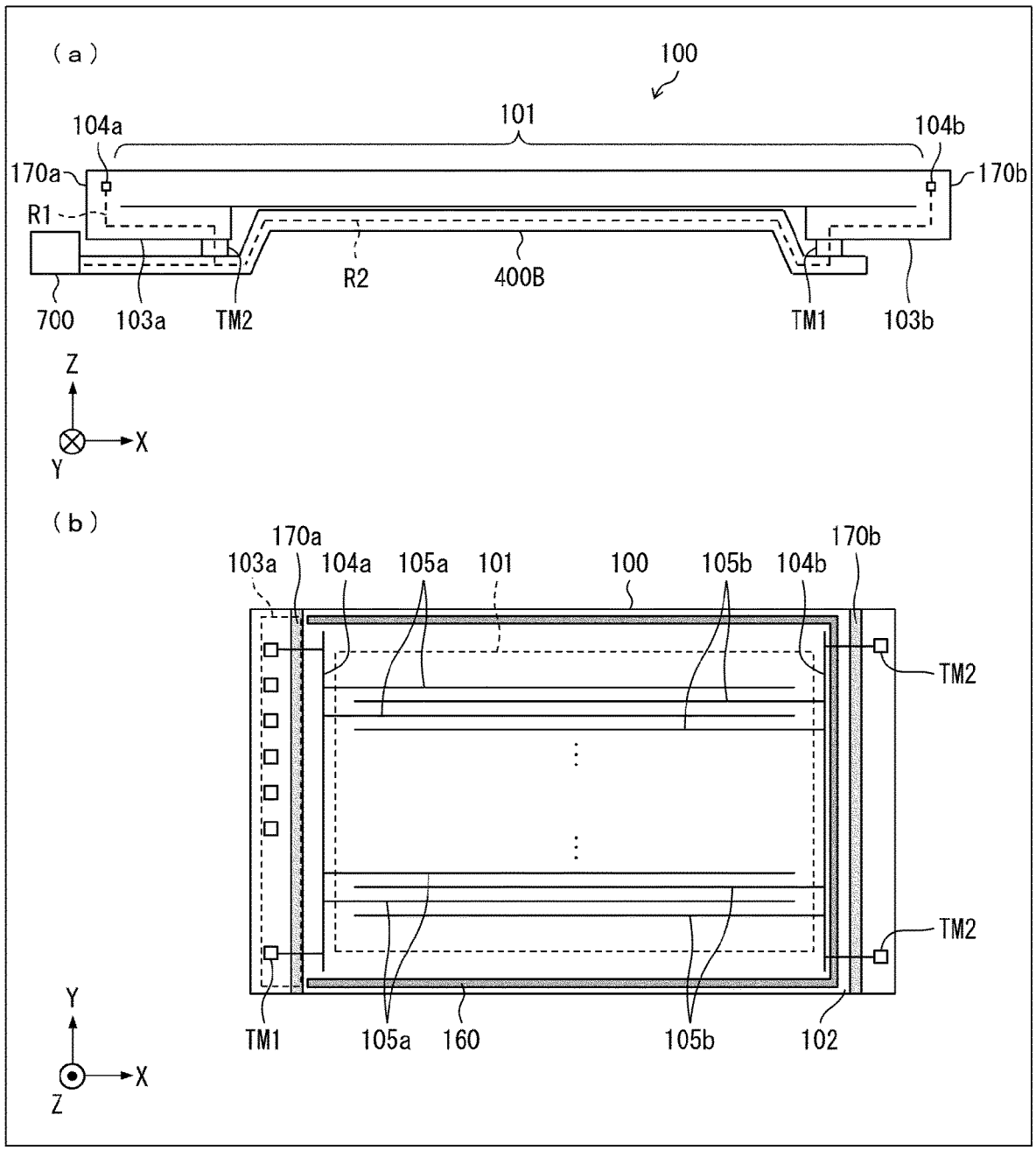
FIG. 21(a) is a cross-sectional view schematically illustrating a configuration of a display device according to a third embodiment.
FIG. 21(b) is a plan view schematically illustrating the another configuration of the display device according to the third embodiment.

Third Embodiment (a) of FIG. 21 is a cross-sectional view schematically illustrating a configuration of a display device according to a third embodiment of the disclosure, and (b) of FIG. 21 is a plan view schematically illustrating the configuration of the display device. Note that (a) of FIG. 21 is a diagram illustrating a state following bending of a first bending region 170a and a second bending region 170b described below, and (b) of FIG. 21 is a diagram illustrating a state preceding the bending of the first bending region 170a and the second bending region 170b.

The display device according to the third embodiment differs from the display device according to the first and second embodiments described above in that the display device according to the third embodiment includes the first bending region 170a provided in the non-display region 102 between the display region 101 and the first terminal region 103a and the second bending region 170b provided in the non-display region 102 between the display region 101 and the second terminal region 103b.

In the display device according to the third embodiment, the first bending region 170a and the second bending region 170b are bent with the first terminal region 103a and the second terminal region 103b facing the back face side of the display device.

The terminals included in the flexible substrate 400B are connected to the terminal portions TM1 and TM2 to achieve the connection between the flexible substrate 400B and the first terminal region 103a and the second terminal region 103b.

Other

Figure 22:
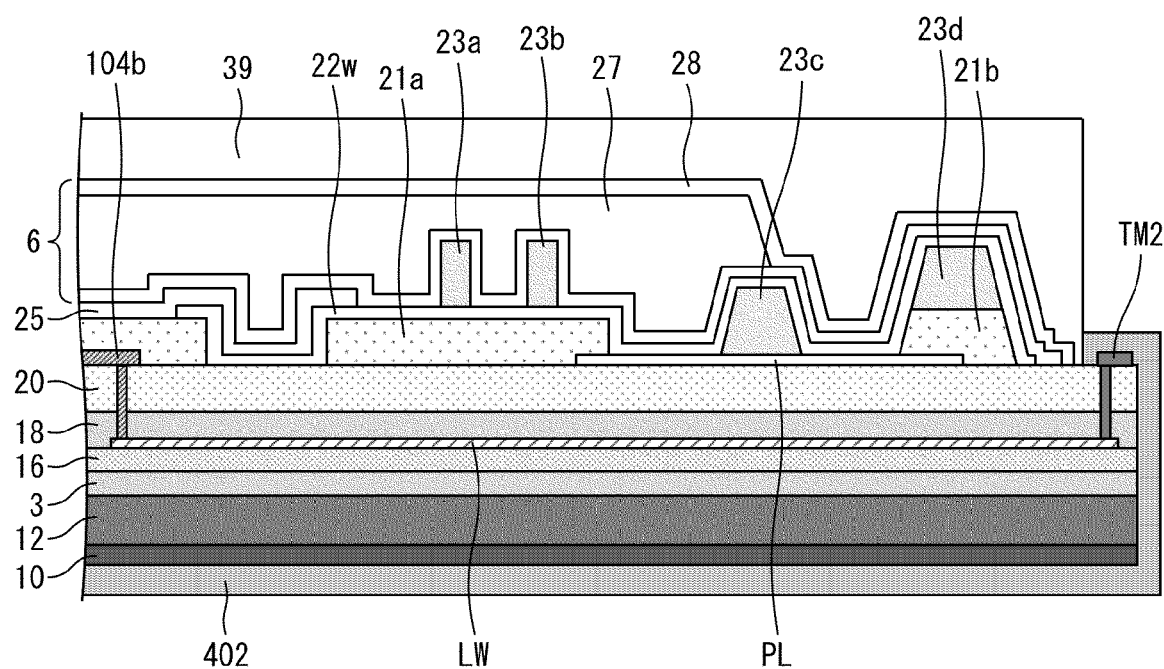
FIG. 22 is a cross-sectional view schematically illustrating the configuration of the display device according to the first and second embodiments.

FIG. 22 is a cross-sectional view illustrating a wiring line connecting each terminal portion TM2 to the second high power supply trunk wiring line 104b in the display devices according to the above-described first to third embodiments. As described above, the low power supply voltage line 160 formed in the non-display region 102 includes the same wiring line layer as that included in the terminal portions TM2 and the second high power supply trunk wiring line 104b, and thus the wiring line connecting each terminal portion TM2 and the second high power supply trunk wiring line 104b includes a wiring line layer different from the wiring line layer included in each terminal portion TM2, the second high power supply trunk wiring line 104b, and the low power supply voltage line 160.

Specifically, as illustrated in FIG. 22, each terminal portion TM2 is connected to one end of a wiring line layer LW via a contact hole penetrating the inorganic insulating film 18 and the inorganic insulating film 20. The wiring line LW includes a wiring line layer in a lower layer underlying the low power supply voltage line 160 (designated as "PL" in FIG. 22). In FIG. 22, the wiring line LW includes the same wiring line layer as that included in the gate electrode GE and the gate wiring line GH. The other end of the wiring line LW is connected to the second high power supply trunk wiring line 104b via a contact hole penetrating the inorganic insulating film 18 and the inorganic insulating film 20.

Note that FIG. 22 illustrates various members of the display device but that members unrelated to the embodiments of the disclosure will not be described.

Supplement

An electro-optical element (an electro-optical element whose luminance and transmittance are controlled by an electric current) that is provided in a display device according to the present embodiment is not particularly limited thereto. Examples of the display device according to the present embodiment include an organic Electro Luminescence (EL) display provided with an Organic Light Emitting Diode (OLED) as an electro-optical element, an inorganic EL display provided with an inorganic light emitting diode as an electro-optical element, and a Quantum dot Light Emitting Diode (QLED) display provided with a QLED as an electro-optical element.

First Aspect

A display device including a display panel including:

a display region, a first terminal region and a second terminal region facing each other across the display region, a first high power supply trunk wiring line disposed between the display region and the first terminal region, a second high power supply trunk wiring line disposed between the display region and the second terminal region, and a high power supply voltage line that is a branch line disposed in the display region and branching from the first high power supply trunk wiring line or the second high power supply trunk wiring line, wherein the first high power supply trunk wiring line is connected via the first terminal region to a high power supply voltage source provided outside the display panel, and the second high power supply trunk wiring line is connected to the high power supply voltage source via the second terminal region and a flexible cable connected to the second terminal region.

Second Aspect

The display device according to the first aspect, wherein the high power supply voltage line is connected at one end to the first high power supply trunk wiring line, and at another end to the second high power supply trunk wiring line.

Third Aspect

The display device according to the first aspect, wherein the display panel includes a plurality of the high power supply voltage lines, and the plurality of high power source voltage lines include a first high power supply voltage line connected at one end to the first high power supply trunk wiring line and terminated at another end, and a second high power supply voltage line connected at one end to the second high power supply trunk wiring line and terminated at another end.

Fourth Aspect

The display device according to the third aspect, wherein the display region includes a plurality of subpixels in an RGB arrangement, and for two of the high power supply voltage lines, the two high power supply voltage lines being electrically connected to the subpixels in an identical color in the display region and being adjacent to each other, one of the two high power supply voltage lines is the first high power supply voltage line, and the other is the second high power supply voltage line.

Fifth Aspect

The display device according to the fourth aspect, wherein, for two of the high power supply voltage lines, the two high power supply voltage lines being electrically connected to the subpixels in different colors in the display region and being adjacent to each other, both of the two high power supply voltage lines are the first high power supply voltage lines, or both of the two high power supply voltage lines are the second high power supply voltage lines.

Sixth Aspect

The display device according to the third aspect, wherein the display region includes a plurality of subpixels in an RGB arrangement, for two of the high power supply voltage lines, the two high power supply voltage lines being electrically connected to the subpixels in an identical color in the display region and being adjacent to each other, both of the two high power supply voltage lines are the first high power supply voltage lines, or both of the two high power supply voltage lines are the second high power supply voltage lines, and for two of the high power supply voltage lines, the two high power supply voltage lines being electrically connected to the subpixels in different colors in the display region and being adjacent to each other, both of the two high power supply voltage lines are the first high power supply voltage lines, or both of the two high power supply voltage lines are the second high power supply voltage lines.

Seventh Aspect

The display device according to the third aspect, wherein the display region includes a plurality of subpixels in a Pentile arrangement, and the first high power supply voltage lines and the second high power supply voltage lines are alternately connected to rows of pixels each including the subpixels in different colors, at intervals of a prescribed number of rows.

Eighth Aspect

The display device according to the seventh aspect, wherein the display region includes rows including the subpixels in two different colors alternately arranged and rows including the subpixels in one color contiguously arranged, the one color being different from the two different colors of the subpixels in the two colors, the rows including the subpixels in the two different colors and the rows including the subpixels in the one color being alternately arranged.

Ninth Aspect

The display device according to the third aspect, wherein the display region includes a plurality of subpixels in an RGBW arrangement, and for two of the high power supply voltage lines, the two high power supply voltage lines being electrically connected to the subpixels in an identical color in the display region and being adjacent to each other, one of the two high power supply voltage lines is the first high power supply voltage line, and the other is the second high power supply voltage line.

Tenth Aspect

The display device according to the third aspect, wherein the display region includes a plurality of subpixels in a Delta arrangement, and for two of the high power supply voltage lines, the two high power supply voltage lines being electrically connected to rows of the subpixels arranged along a column direction of the subpixels, with the subpixels adjacent to each other and in different colors being offset from each other by half of a subpixel width, the two high power supply voltage lines being adjacent to each other, one of the two high power supply voltage lines is the first high power supply voltage line, and the other is the second high power supply voltage line.

Eleventh Aspect

The display device according to the third aspect, wherein the display region includes a plurality of subpixels in a Delta arrangement, and the first high power supply voltage lines and the second high power supply voltage lines are alternately connected to respective rows of the subpixels arranged along a column direction of the subpixels at intervals of a prescribed number of rows of the subpixels, with the subpixels adjacent from each other and in different colors being arranged offset from each other by half of a subpixel width.

Twelfth Aspect

The display device according to the eleventh aspect, wherein the prescribed number of rows correspond to one row of pixels each including subpixels.

Thirteenth Aspect

The display device according to the eleventh aspect, wherein the prescribed number of rows corresponds to a plurality of rows of pixels each including subpixels.

Fourteenth Aspect

The display device according to any one of first to thirteenth aspects, wherein the flexible cable extends along a back face of the display panel.

Fifteenth Aspect

The display device according to the fourteenth aspect, wherein the flexible cable passes through a central portion of the display region when the flexible cable is viewed from a back face side of the display panel.

Sixteenth Aspect

The display device according to the fourteenth aspect, wherein the flexible cable includes a first flexible cable and a second flexible cable, the first flexible cable passes through one end portion of the display region when the first flexible cable is viewed from a back face side of the display panel, and the second flexible cable passes through another end portion of the display region when the second flexible cable is viewed from a back face side of the display panel.

Seventeenth Aspect

The display device according to any one of first to sixteenth aspects, wherein the first terminal region is larger than the second terminal region.

Eighteenth Aspect

The display device according to any one of first to seventeenth aspects, wherein a data signal exchanged between the display panel and an exterior of the display panel is input into the first terminal region.

Nineteenth Aspect

The display device according to any one of first to eighteenth aspects, wherein the display panel includes a plurality of the second terminal regions.

Twentieth Aspect

The display device according to any one of first to nineteenth aspects, wherein the high power supply voltage source is connected to the first terminal region via a flexible substrate.

Twenty-first Aspect

A display device including a display panel including:

a display region, a first terminal region and a second terminal region facing each other across the display region, a first high power supply trunk wiring line disposed between the display region and the first terminal region, a second high power supply trunk wiring line disposed between the display region and the second terminal region, a high power supply voltage line that is a branch line disposed in the display region and branching from the first high power supply trunk wiring line or the second high power supply trunk wiring line, a first bending region provided in a non-display region between the display region and the first terminal region, and a second bending region provided in a non-display region between the display region and the second terminal region, wherein the first high power supply trunk wiring line is connected via the first terminal region to a high power supply voltage source provided outside the display panel, and/or the second high power supply trunk wiring line is connected to the high power supply voltage source via the second terminal region.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
a display panel including:
a display region,
a first terminal region and a second terminal region facing each other across the display region,
a first high power supply trunk wiring line disposed between the display region and the first terminal region,
a second high power supply trunk wiring line disposed between the display region and the second terminal region, and
a high power supply voltage line that is a branch line disposed in the display region and branching from the first high power supply trunk wiring line or the second high power supply trunk wiring line,
wherein a voltage output from a high power supply voltage source that is provided outside the display panel is supplied to the first high power supply trunk wiring line via the first terminal region, and
the voltage output from the high power supply voltage source is supplied to the second high power supply trunk wiring line via the second terminal region and a flexible cable connected to the second terminal region.

2. The display device according to claim 1,
wherein the high power supply voltage line is connected at one end to the first high power supply trunk wiring line, and at another end to the second high power supply trunk wiring line.

3. The display device according to claim 1,
wherein the display panel includes a plurality of high power supply voltage lines, each of the plurality of the high power supply voltage lines includes the high power supply voltage line, and
the plurality of high power supply voltage lines includes a first high power supply voltage line connected at one end to the first high power supply trunk wiring line and terminated at another end, and a second high power supply voltage line connected at one end to the second high power supply trunk wiring line and terminated at another end.

4. The display device according to claim 3,
wherein the display region includes a plurality of subpixels in an RGB arrangement, and
for two of the high power supply voltage lines, the two high power supply voltage lines being electrically connected to the subpixels in an identical color in the display region and being adjacent to each other, one of the two high power supply voltage lines is the first high power supply voltage line, and the other is the second high power supply voltage line.

5. The display device according to claim 4,
wherein, for two of the high power supply voltage lines, the two high power supply voltage lines being electrically connected to the subpixels in different colors in the display region and being adjacent to each other, each of the two high power supply voltage lines is the first high power supply voltage line, or each of the two high power supply voltage lines is the second high power supply voltage line.

6. The display device according to claim 3,
wherein the display region includes a plurality of subpixels in an RGB arrangement,
for two of the high power supply voltage lines, the two high power supply voltage lines being electrically connected to the subpixels in an identical color in the display region and being adjacent to each other, each of the two high power supply voltage lines is the first high power supply voltage line, or each of the two high power supply voltage lines is the second high power supply voltage line, and
for two of the high power supply voltage lines, the two high power supply voltage lines being electrically connected to the subpixels in different colors in the display region and being adjacent to each other, each of the two high power supply voltage lines is the first high power supply voltage line, or each of the two high power supply voltage lines is the second high power supply voltage line.

7. The display device according to claim 3,
wherein the display region includes a plurality of subpixels in a Pentile arrangement, and
the first high power supply voltage line and the second high power supply voltage line are alternately connected to rows of pixels each including the subpixels in different colors, at intervals of a predetermined number of rows.

8. The display device according to claim 7,
wherein the display region includes rows including the subpixels in two different colors alternately arranged and rows including the subpixels in one color contiguously arranged, the one color being different from the two different colors, the rows including the subpixels in the two different colors and the rows including the subpixels in the one color being alternately arranged.

9. The display device according to claim 3,
wherein the display region includes a plurality of subpixels in an RGBW arrangement, and
for two of the high power supply voltage lines, the two high power supply voltage lines being electrically connected to the subpixels in an identical color in the display region and being adjacent to each other, one of the two high power supply voltage lines is the first high power supply voltage line, and the other is the second high power supply voltage line.

10. The display device according to claim 3,
wherein the display region includes a plurality of subpixels in a Delta arrangement, and
for two of the high power supply voltage lines, the two high power supply voltage lines being electrically connected to rows of the subpixels arranged along a column direction of the subpixels, with the subpixels adjacent to each other and in different colors being offset from each other by half of a subpixel width, the two high power supply voltage lines being adjacent to each other, one of the two high power supply voltage lines is the first high power supply voltage line, and the other is the second high power supply voltage line.

11. The display device according to claim 3,
wherein the display region includes a plurality of subpixels in a Delta arrangement, and
the first high power supply voltage line and the second high power supply voltage line are alternately connected to respective rows of the subpixels arranged along a column direction of the subpixels at intervals of a predetermined number of rows of the subpixels, with the subpixels adjacent from each other and in different colors being arranged offset from each other by half of a subpixel width.

12. The display device according to claim 11,
wherein the predetermined number of rows corresponds to one row of pixels each including subpixels.

13. The display device according to claim 11,
wherein the predetermined number of rows corresponds to a plurality of rows of pixels each including subpixels.

14. The display device according to claim 1,
wherein the flexible cable extends along a back face of the display panel.

15. The display device according to claim 14,
wherein the flexible cable is provided in a central portion of the display region when the flexible cable is viewed from a back face side of the display panel.

16. The display device according to claim 14,
wherein the flexible cable includes a first flexible cable and a second flexible cable,
the first flexible cable is provided in one end portion of the display region when the first flexible cable is viewed from a back face side of the display panel, and
the second flexible cable is provided in another end portion of the display region when the second flexible cable is viewed from the back face side of the display panel.

17. The display device according to claim 1,
wherein the first terminal region is larger than the second terminal region.

18. The display device according to claim 1,
wherein a data signal exchanged between the display panel and an exterior of the display panel is input into the first terminal region.

19. The display device according to claim 1,
wherein the display panel includes a plurality of second terminal regions, each of the plurality of the second terminal regions includes the second terminal region.

20. The display device according to claim 1,
wherein the high power supply voltage source is connected to the first terminal region via a flexible substrate.

* * * * *